(12) United States Patent
Hirai et al.

(10) Patent No.: US 7,678,411 B2
(45) Date of Patent: Mar. 16, 2010

(54) METHOD OF FORMING WIRING PATTERN AND METHOD OF FORMING GATE ELECTRODE FOR TFT

(75) Inventors: Toshimitsu Hirai, Chino (JP); Shinri Sakai, Suwa (JP)

(73) Assignee: Seiko Epson Corporation, Toyko (JP)

( * ) Notice: Subject to any disclaimer, the term of this patent is extended or adjusted under 35 U.S.C. 154(b) by 1244 days.

(21) Appl. No.: 11/206,802

(22) Filed: Aug. 19, 2005

(65) Prior Publication Data
US 2006/0045963 A1 Mar. 2, 2006

(30) Foreign Application Priority Data
Aug. 27, 2004 (JP) ............... 2004-247908

(51) Int. Cl.
*B05D 5/12* (2006.01)
(52) U.S. Cl. .................. 427/58; 438/584; 438/674; 438/665; 427/96.1
(58) Field of Classification Search .................. 427/58
See application file for complete search history.

(56) References Cited
U.S. PATENT DOCUMENTS
2005/0022374 A1* 2/2005 Hirai et al. .................. 29/825

FOREIGN PATENT DOCUMENTS
| JP | 11-204529 | 7/1999 |
| JP | 2003-318514 | 11/2003 |
| JP | 2004-006764 | 1/2004 |
| JP | A-2004-006578 | 1/2004 |
| JP | 2004-089878 | 3/2004 |
| JP | 2004-095896 | 3/2004 |
| JP | 2004-141796 | 5/2004 |
| JP | 2004-200244 | 7/2004 |

\* cited by examiner

*Primary Examiner*—Michael Barr
*Assistant Examiner*—Robert S Walters, Jr.
(74) *Attorney, Agent, or Firm*—Oliff & Berridge, PLC

(57) ABSTRACT

The invention provides a method of forming a wiring pattern in which a conductive material layer is formed in a pattern formation region having a first region, which is bordered by a bank pattern and has a first width, and a second region, which touches the first region and has a second width smaller than the first width, on a substrate, by discharging a droplet of a conductive material in a liquid phase using a droplet discharge device. The method includes forming the conductive material layer to cover the first region and the second region, by discharging the droplet having a diameter smaller than the first width and greater than the second width toward the first region. In this case, the droplet is discharged such that the droplet lands at a position that faces a boundary line between the first region and the second region.

6 Claims, 18 Drawing Sheets

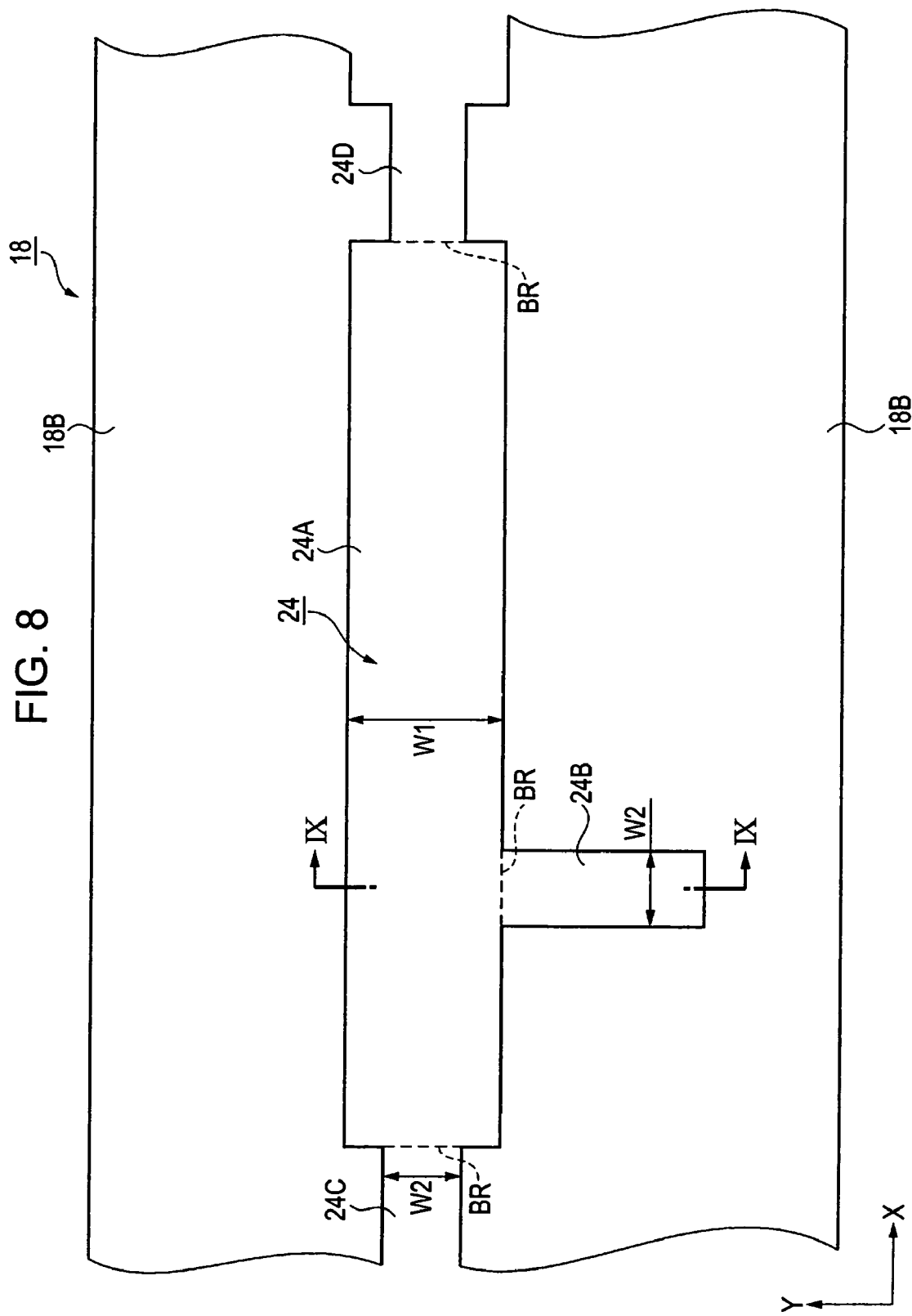

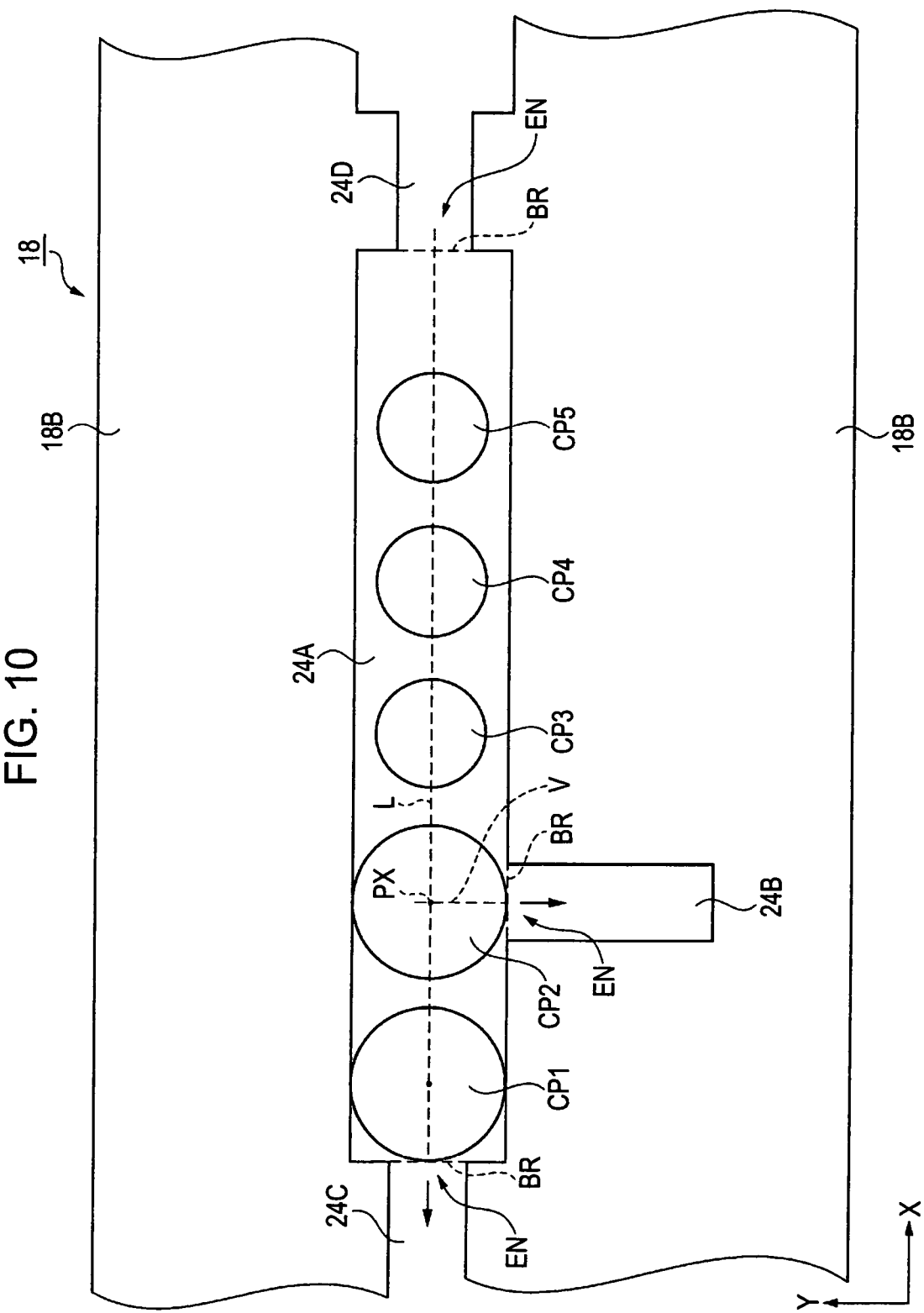

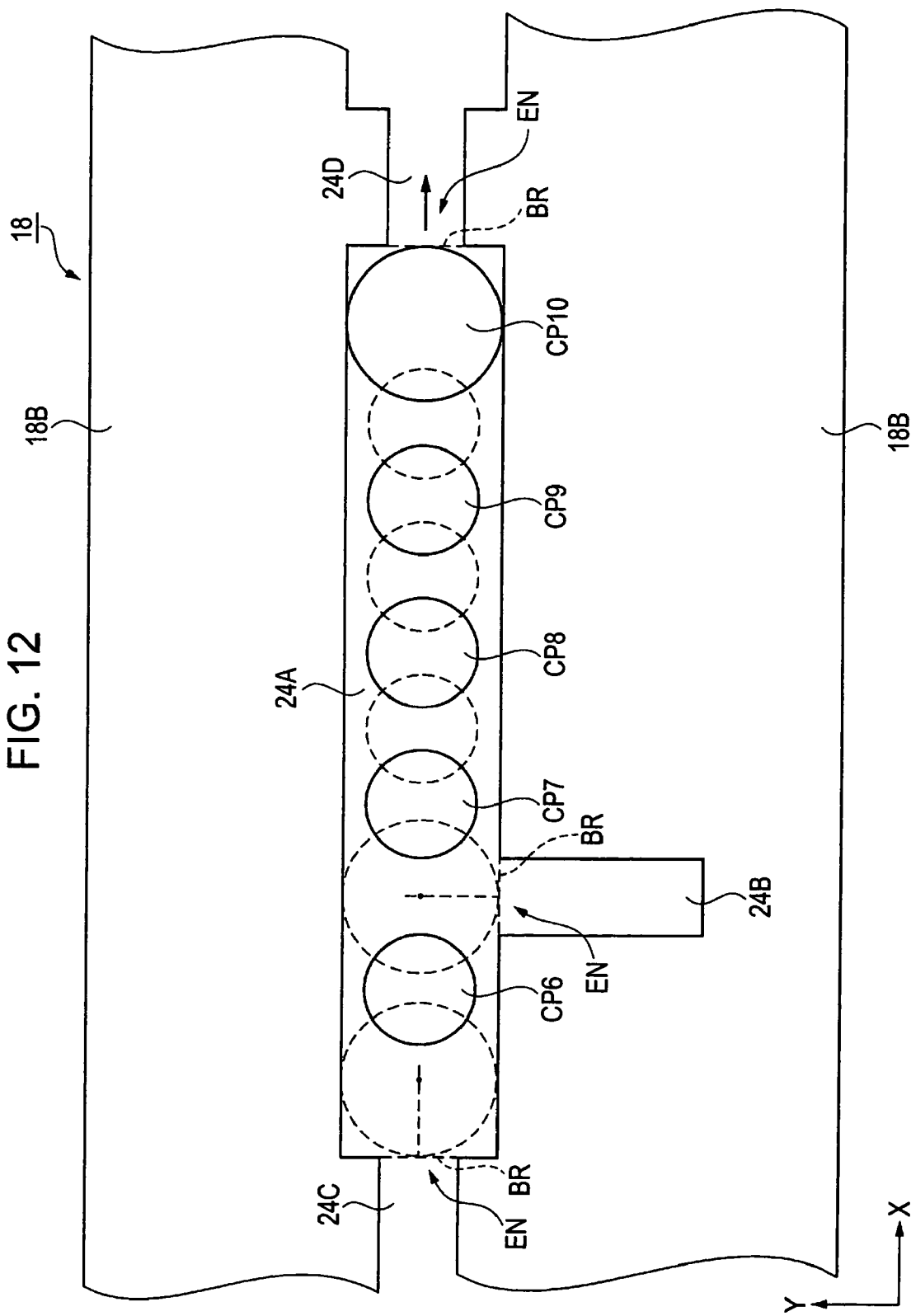

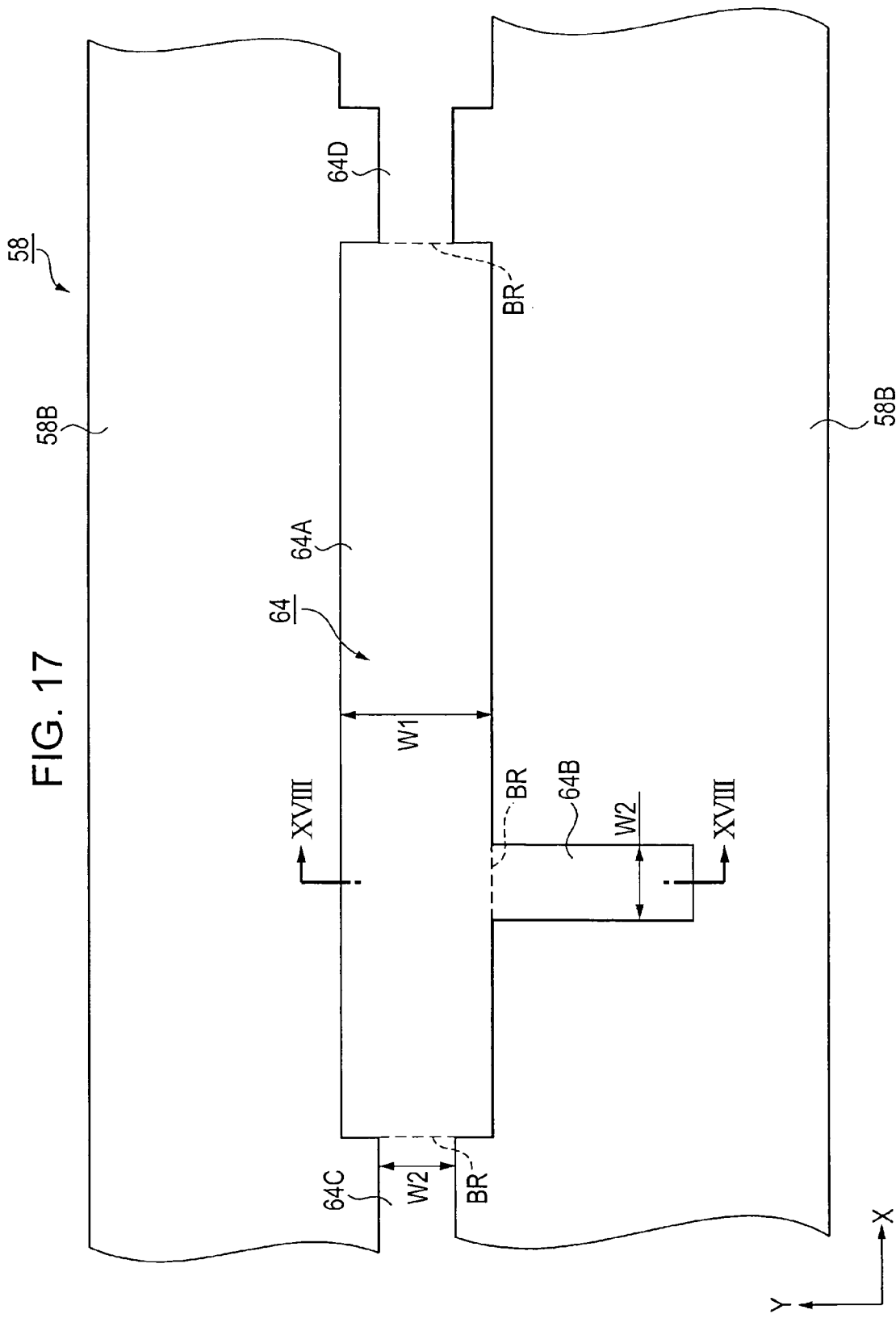

METHOD OF FORMING WIRING PATTERN AND METHOD OF FORMING GATE ELECTRODE FOR TFT

This application claims the benefit of Japanese Patent Application No. 2004-247908, filed Aug. 27, 2004. The entire disclosure of the prior application is hereby incorporated by reference herein in its entirety.

BACKGROUND OF THE INVENTION

1. Technical Field

The present invention relates to a method of forming a wiring pattern using a droplet discharge method, and more specifically, to a method of forming a wiring pattern which is suitable for formation of a gate electrode for a TFT.

2. Related Art

A technique for forming metal wiring lines by the ink jet method has been known in the related art (e.g., Japanese Unexamined Patent Application Publication No. 2004-6578).

The width of the gate electrode for a TFT is about 10 µm. In particular, the size (diameter) of a droplet which can be stably discharged by a head of an existing droplet discharge device is greater than the width of the gate electrode. For this reason, if droplets of a conductive material for forming the gate electrode are dropped in a region in which the gate electrode will be formed, there is a case where the droplet is attached onto other regions outside that region. The droplet that is attached outside that region generates residual debris in the conductive material. Further, if the residual debris is generated, the gate length and the gate width of the gate electrode are not within design values. Consequently, the device characteristics of the TFT may deviate from the determined design values.

However, the head of a conventional droplet discharge device can directly discharge droplets having a diameter smaller than the width of the gate electrode toward the electrode formation region. In this case, however, if accidental deflection occurs, there is a case where the droplet is adhered to portions other than the region where a gate electrode must be formed. Therefore, even in this case, the gate length and the gate width of the gate electrode that is finally obtained deviate from predetermined design values. Furthermore, if the size of the droplet becomes small, the volume of the droplet becomes small, and the number of droplets that are necessary to form the gate electrode increases accordingly. As a result, the time for forming the gate electrode increases.

SUMMARY

An advantage of the invention is that it provides a conductive material layer formed in a region having a width smaller than the diameter of a droplet without discharging the droplet to the region from a droplet discharge device.

According to an aspect of the invention, there is provided a method of forming a wiring pattern in which a conductive material layer is formed in a pattern formation region having a first region, which is bordered by a bank pattern and has a first width, and a second region, which touches the first region and has a second width smaller than the first width, on a substrate, by discharging a droplet of a conductive material in a liquid phase using a droplet discharge device. The method includes the step (A) of forming the conductive material layer to cover the first region and the second region, by discharging the droplet having a diameter smaller than the first width and greater than the second width toward the first region. Further, the step (A) includes the step (a1) of discharging the droplet such that the droplet lands at a position that faces a boundary line between the first region and the second region.

One of the advantageous effects obtained by the above construction is that a conductive material layer can be formed in a region (the second region) having a width smaller than the diameter of a droplet from the droplet discharge device, without discharging the droplet to the region.

The step (A) preferably includes the step of discharging the droplet toward only the first region of the first region and the second region.

One of the advantageous effects obtained by the above construction is that a droplet is not adhered outside the second region because it is not discharged toward the second region.

The step (a1) preferably includes the step of discharging the droplet so that almost the center of the droplet coincides with a position that is located on a line normal to the boundary line and runs through almost the center of the boundary line, and that is located at a distance almost ½ times to 1 times the diameter from the boundary line.

One of the advantageous effects obtained by the above construction is that a conductive material in a liquid phase can be introduced into the second region more surely.

It is preferable that the step (a1) includes the step of discharging the droplet so that almost the center of the droplet coincides with a position that is located at a distance almost ½ times to 1 times the diameter from a position where a line normal to the boundary line and runs through almost the center of the boundary line and a line segment that divides the first region into two and extends in a direction orthogonal to a direction of the first width intersect each other.

One of the advantageous effects obtained by the above construction is that a conductive material in a liquid phase can be introduced into the second region more certainly.

It is preferable that the step (a1) includes the step of discharging a first droplet onto the normal line to the boundary line.

One of the advantageous effects obtained by the above construction is that a conductive material in a liquid phase can be introduced into the second region more certainly.

According to another aspect of the invention, there is provided a method of forming a wiring pattern in which a conductive material layer is formed in a pattern formation region having a first region, which is bordered by a bank pattern and has a first width, and a second region, which touches the first region and has a second width smaller than the first width, on a substrate, by discharging a plurality of droplets of a conductive material in a liquid phase using a droplet discharge device. The method includes the step (A) of forming the conductive material layer to cover the first region and the second region, by discharging the plurality of droplets having a diameter smaller than the first width and greater than the second width toward the first region. Further, the step (A) includes the step (a1) of discharging the plurality of droplets so that one droplet, which lands at a position closest to a boundary line between the first region and the second region, among the plurality of droplets is isolated from other droplets during a predetermined period of time on the first region.

One of the advantageous effects obtained by the aforementioned construction is that a conductive material layer can be formed in a region (the second region) having a width smaller than the diameter of a droplet without discharging the droplet to the region from a droplet discharge device.

The step (A) preferably includes the step of discharging the plurality of droplets toward only the first region of the first region and the second region.

One of the advantageous effects obtained by the construction is that a droplet is not attached outside the second region since it is not discharged toward the second region.

It is preferable that the step (A) includes the step of discharging the one droplet and the other droplets so that the volume of the one droplet becomes greater than that of the other droplets.

One of the advantageous effects accomplished by the construction is that the volume of a conductive material in a liquid phase, in which one droplet flows into the second region, can increase.

In addition, aspects of the invention can be implemented in various ways. For instance, the invention can be applied to a type in which the bank pattern is substituted with a liquid-repellant pattern.

The pattern formation region preferably has a lyophilic property to a conductive material in a liquid phase.

One of the advantageous effects accomplished by the above-mentioned construction is that a conductive material in a liquid phase can easily spread on the pattern formation region.

In the above aspect of the invention, the method of forming the gate electrode for a TFT includes the wiring pattern forming method. In this case, the first region is a region in which a broad portion of a gate wiring line is formed, and the second region is a region in which a gate electrode branched from the gate wiring line is formed.

One of the advantageous effects obtained by the construction is that a TFT with good device characteristics can be formed using a droplet discharge device.

BRIEF DESCRIPTION OF THE DRAWINGS

The invention will be described with reference to the accompanying drawings, wherein like numbers refer to like elements, and wherein:

FIG. 8 is a schematic diagram showing a pattern formation region that is bordered by the bank pattern according to the first and second embodiments;

FIG. 10 is a schematic diagram showing a discharge process according to the first embodiment;

FIG. 12 is a schematic diagram showing the discharge process according to the first embodiment;

FIG. 17 is a schematic diagram showing a pattern formation region that is bordered by the liquid-repellant pattern;

DESCRIPTION OF THE EMBODIMENTS

First Embodiment

An example in which a method of forming a wiring pattern according to the invention is applied to a process of fabricating a gate electrode for a TFT will be described. The wiring pattern forming method according to the present embodiment includes a process of discharging a droplet of a conductive material to form a wiring pattern composed of a conductive layer on an object, by means of a droplet discharge method. Here, the term "wiring pattern" is used to mean a type of "thin film pattern". Further, a conductive material of the present embodiment will also be referred to as "ink for forming a wiring pattern" and "functional liquid".

Figure 1:
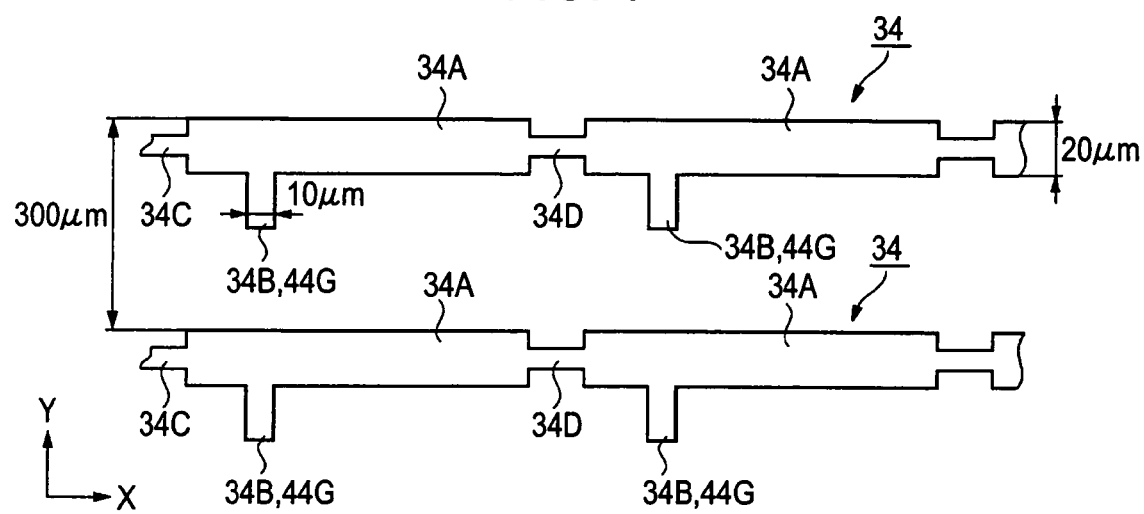
FIG. 1 is a schematic diagram showing a plurality of gate wiring lines formed by a method of forming a wiring pattern according to first to third embodiments.

Each of a plurality of gate wiring lines 34 shown in FIG. 1 corresponds to a "wiring pattern" of the invention. In this case, the distance between the plurality of gate wiring lines 34 is approximately 300 μm. Further, each of the plurality of gate wiring lines 34 has a broad portion 34A, and narrow portions 34B, 34C, and 34D.

The broad portion 34A is a portion having a stripe shape, which extends in the X-axis direction in each of the gate wiring lines 34. Further, the width of the broad portion 34A, i.e., the length of the broad portion 34A in a direction orthogonal to its longitudinal direction is greater than the width of the narrow portions 34B, 34C and 34D. To be more specific, the width of the broad portion 34A is approximately 20 μm. The narrow portion 34B is a portion projecting from the broad portion 34A in the Y-axis direction, which is also a gate electrode 44G (FIG. 13) of a TFT element 44 (FIG. 13). The width of the narrow portion 34B is approximately 10 μm. The narrow portions 34C and 34D are portions that connect the broad portions 34A with each other. Furthermore, the narrow portions 34C and 34D are portions overlapping a source electrode line 44SL (FIG. 13) with a gate insulating film 42 (FIG. 13) therebetween. Further, the source electrode line 44SL is a wiring line extending in a direction (the Y-axis direction) orthogonal to a direction (the X-axis direction) in which the gate wiring lines 34 extend.

(A. Ink for Forming a Wiring Pattern)

A conductive material used to form the gate wiring lines 34 will now be described. Here, the conductive material is a type of "a material in a liquid phase" and is also referred to as "ink for forming a wiring pattern". The conductive material contains a dispersion medium, and minute conductive particles dispersed in the dispersion medium. The minute conductive particles according to the present embodiment are silver particles having a mean particle diameter of about 10 nm. Further, particles having a mean particle diameter from about 1 nm to several hundreds of nanometers are referred to as "nano particles". According to this method, the conductive material in the present embodiment contains nano particles of silver.

In this case, the grain size of the minute conductive particles is preferably in a range of 1 nm to 1.0 μm. If the grain size is below 1.0 μm, there is a low possibility that nozzles 118 (FIG. 4) of a head 114 may be clogged. Meanwhile, if the grain size is over 1 nm, the volume ratio of a coating agent to the minute conductive particles becomes suitable. Thus, the ratio of an organic substance in a film obtained becomes adequate.

The dispersing agent (or a solvent) is not specially limited so long as it can disperse minute conductive particles without causing aggregation. For example, the dispersing agent may include water, alcohols such as methanol, ethanol, propanol and butanol; hydrocarbon-based compounds such as n-heptane, n-octane, decane, dodecane, tetradecane, toluene, xylene, cymene, durene, indene, dipentene, tetrahydronaphthalene, decahydronaphthalene and cyclohexylbenzene; ether-based compounds such as ethyleneglycoldimethylether, ethyleneglycoldiethylether, ethyleneglycolmethylethylether, diethyleneglycoldimethylether, diethyleneglycoldiethylether, diethyleneglycolmethylethylether, 1,2-dimethoxyethane, bis(2-methoxyethyl) ether and p-dioxane; and polar compounds such as propylenecarbonate, γ-butyrolactone, N-methyl-2-pyrrolidone, dimethylformamide, dimethylsulfoxide and cyclohexanone. Among them, in terms of the dispersibility of minute conductive particles, the stability of a dispersion liquid and easy application to a droplet discharge method, water, alcohols, hydrocarbon-based compounds and ether-based compounds are preferred as the dispersion media. More preferred dispersion media might include water and hydrocarbon-based compounds.

The term "material in a liquid phase" refers to a material with viscosity, which can be discharged as droplets from the nozzles 118 (FIG. 4) of the droplet discharge device. In this case, the material in a liquid phase can be aqueous or oil-like. The material in a liquid phase can include any materials so long as they have flowability (viscosity) that can be discharged from the nozzle, and any materials that are fluid even if they contain a solid material. It is preferred that the material in a liquid phase has a viscosity ranging from 1 mPa·s to 50 mPa·s. When a material in a liquid phase is discharged as droplets by means of a droplet discharge method, the circumference of the nozzle is hardly contaminated with ink when the viscosity is 1 mPa·s or higher. Meanwhile, if the viscosity is 50 mPa·s or lower, the droplet can be discharged more smoothly because the clogging frequency of the nozzle is minimal.

In addition, the surface tension of the material in a liquid phase preferably ranges from 0.02 N/m to 0.07 N/m. When a conductive material is discharged by the droplet discharge method, if the surface tension is 0.02 N/m or higher, deflection hardly occurs because the wettability of ink to the nozzle surface becomes adequate. Meanwhile, if the surface tension is 0.07 N/m or lower, the shape of the meniscus at the front end of the nozzle is further stabilized. It is thus possible to more easily control the discharge quantity or discharge timing. In order to control the surface tension, a minute amount of a fluorine-based, silicon-based or non-ion-based surface tension regulator can be added to the dispersion agent to the extent that a contact angle with an object is not significantly decreased. The non-ion-based surface tension regulator serves to improve the wettability of ink to an object, thereby improving the leveling property of a film, and to also prevent generation of fine irregularities in the film. The surface tension regulator can contain organic compounds such as alcohol, ether, ester and ketone, if needed.

(B. Overall Construction of Device Manufacturing Apparatus)

Figure 2:
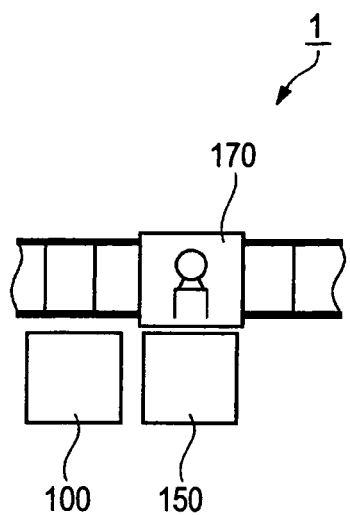
FIG. 2 is a schematic diagram showing the construction of a device manufacturing apparatus according to the first to third embodiments.
Figure 3:
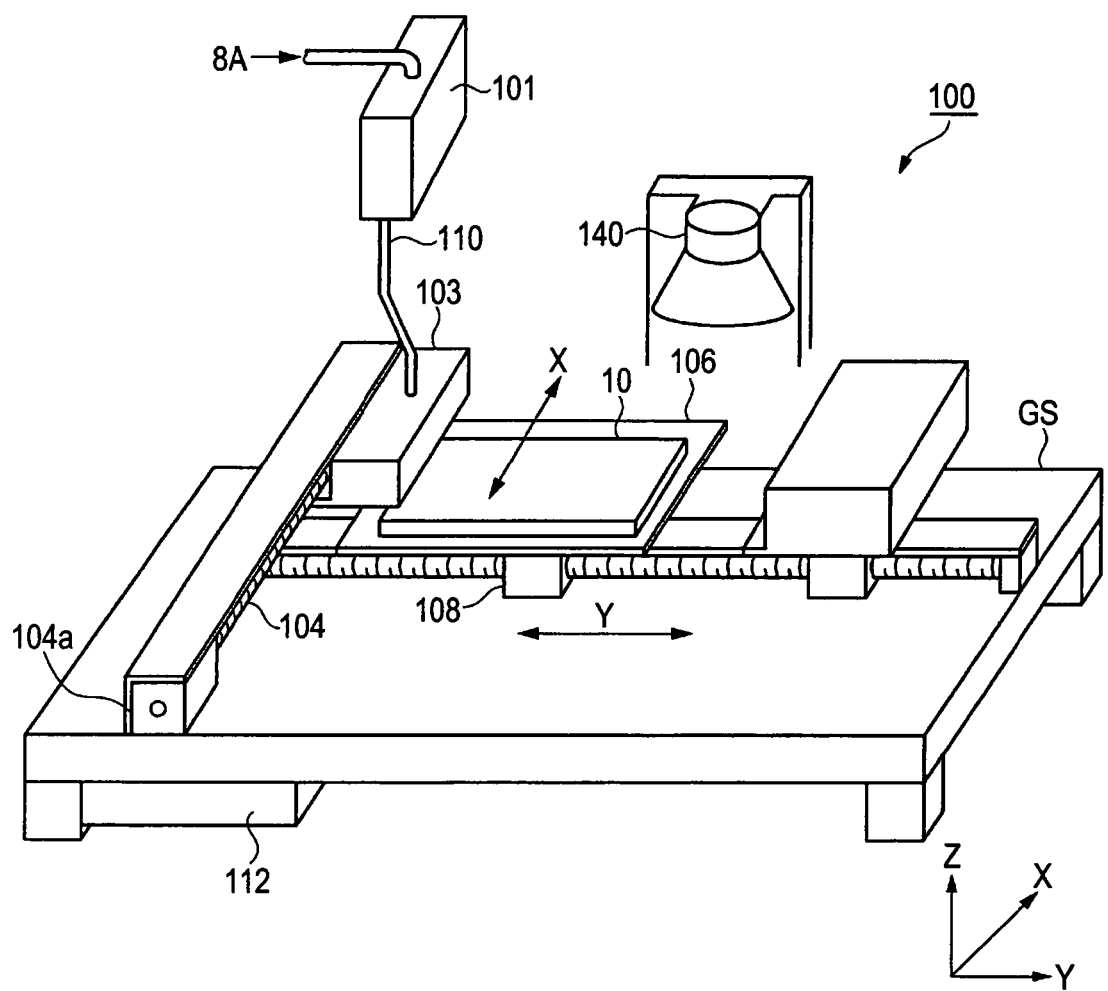
FIG. 3 is a schematic diagram showing the construction of a droplet discharge device according to the first to third embodiments.

A device manufacturing apparatus for forming wiring patterns will be described below. The device manufacturing apparatus 1 shown in FIG. 2 is a part of an apparatus for manufacturing a liquid crystal display device. Further, the device manufacturing apparatus 1 includes a droplet discharge device 100, a clean oven 150 and a carrier device 170. The droplet discharge device 100 is adapted to form a conductive material layer on a base 10 by discharging droplets of a conductive material to the base 10 (FIG. 3). Meanwhile, the clean oven 150 serves to activate the conductive material layer formed by the droplet discharge device 100 to form a conductive layer.

The carrier device 170 includes a fork part, a driving unit that moves the fork part up and down, and a free-running part. Further, the carrier device 170 carries the base 10 so that the base 10 can undergo the processing by the droplet discharge device 100 and the clean oven 150 in this order. Hereinafter, the structure and functions of the droplet discharge device 100 will be described in detail.

As shown in FIG. 3, the droplet discharge device 100 is a so-called inkjet device. In particular, the droplet discharge device 100 includes a tank 101 that retains a conductive material 8A, a tube 110, a ground stage GS, a discharge head unit 103, a stage 106, a first position control unit 104, a second position control unit 108, a control system 112, a support 104a and a heater 140.

The discharge head unit 103 retains a head 114 (FIG. 4). The head 114 discharges droplets of the conductive material 8A according to a driving signal from the control system 112. Further, the head 114 of the discharge head unit 103 is coupled to the tank 101 by the tube 110. For this reason, the conductive material 8A is supplied from the tank 101 to the head 114.

The stage 106 provides a flat surface for fixing the base 10. The flat surface of the stage 106 is parallel to the X-axis direction and the Y-axis direction. The stage 106 also serves to fix the position of the base 10 using suction power.

The first position control unit 104 is fixed to a position of a predetermined height from the ground stage GS by means of the support 104a. The first position control unit 104 functions to move the discharge head unit 103 in the X-axis direction and in the Z-axis direction orthogonal to the X-axis direction, according to a signal from the control system 112. The first position control unit 104 also serves to rotate the discharge head unit 103 around an axis parallel to the Z axis. In this case, in the present embodiment, the Z-axis direction is a direction parallel to a vertical direction (i.e., a direction of gravitational acceleration).

The second position control unit 108 moves the stage 106 in the Y-axis direction on the ground stage GS according to a signal from the control system 112. In this case, the Y-axis direction is a direction orthogonal to both the X-axis direction and the Z-axis direction.

The construction of the first position control unit 104 having the above functions and the construction of the second position control unit 108 having the above functions can be implemented using a known XY robot using a linear motor and a servo motor. Thus, a detailed description thereof will be omitted herein. Further, in the present specification, the first position control unit 104 and the second position control unit 108 will also be referred to as a "robot" or "scanning unit", respectively.

Furthermore, in the present embodiment, the X-axis direction, the Y-axis direction and the Z-axis direction coincide with the direction in which one of the discharge head unit 103 and the stage 106 moves relative to the other. Among them, the X-axis direction will also be referred to as a "scanning direction". The Y-axis direction will also be referred to as a "non-scanning direction". Further, a virtual starting point of the XYZ coordinate system that defines the X-axis direction, the Y-axis direction, and the Z-axis direction is fixed to a reference portion of the droplet discharge device 100. Further, in the present specification, X coordinates, Y coordinates, and Z coordinates are coordinates in this XYZ coordinate system. Moreover, the virtual starting point may be fixed to the stage 106 as well as the reference portion, and may also be fixed to the discharge head unit 103.

As described above, the discharge head unit 103 moves in the X-axis direction by means of the first position control unit 104. Further, the base 10 moves in the Y-axis direction together with the stage 106 by means of the second position control unit 108. As a result, the position of the head 114 relative to the base 10 changes. More specifically, this operation causes the discharge head unit 103, the head 114 or the nozzles 118 (FIG. 4) to relatively move in the X-axis direction and the Y-axis direction, i.e., perform scanning in a relative way, while maintaining a predetermined distance from the base 10 in the Z-axis direction. The term "relative moving" or "relative scanning" means that one of a first side where the droplets of the conductive material 8A are discharged and a second side in which the droplets land from the first side (a target discharge portion) moves relative to the other.

The control system 112 is adapted to receive discharge data from an external information processing unit. The control system 112 stores the received discharge data in a storage unit 202 (FIG. 5), and controls the first position control unit 104, the second position control unit 108 and the head 114 according to the stored discharge data. In this case, the term "discharge data" refers to data indicating a relative position where droplets of the conductive material 8A are to be discharged. In the present embodiment, the discharge data has a data format of bit map data.

Through the above-described construction, the droplet discharge device 100 can move the nozzles 118 (FIG. 4) of the head 114 relative to the base 10 according to the discharge data and can control the nozzles 118 to discharge droplets of the conductive material 8A toward set landing positions from the nozzles 118. Further, a combination of relative motion of the head 114 by the droplet discharge device 100 and discharge of droplets of the conductive material 8A from the nozzles 118 is also referred to as "coating scanning" or "discharge scanning".

Furthermore, in the present specification, a portion where droplets of the conductive material 8A have landed will be referred to as a "target discharge portion". Further, a portion that gets wet where the landed droplets spread will be referred to as a "target coating portion". Both the "target discharge portion" and the "target coating portion" are portions which are formed by performing a surface reforming treatment on an underlying object so that the conductive material 8A has a desired contact angle. Even if the surface reforming treatment is not performed, a surface of an underlying object has a desired liquid-repellant property or a lyophilic property (i.e., the landed conductive material 8A has a preferred contact angle on the surface of the object on the substrate) to the conductive material 8A; however, the surface itself of the underlying object may be the "target discharge portion" or the "target coating portion". A pattern formation region 24 to be described below includes the "target discharge portion" and the "target coating portion". Further, in the present specification, the "target discharge portion" will also be referred to as a "target" or "receiving portion".

Referring back to FIG. 3, the heater 140 is an infrared (IR) lamp for annealing the base 10. The supply or shutdown of power to the heater 140 is also controlled by the control system 112.

(C. Head)

Figure 4A:
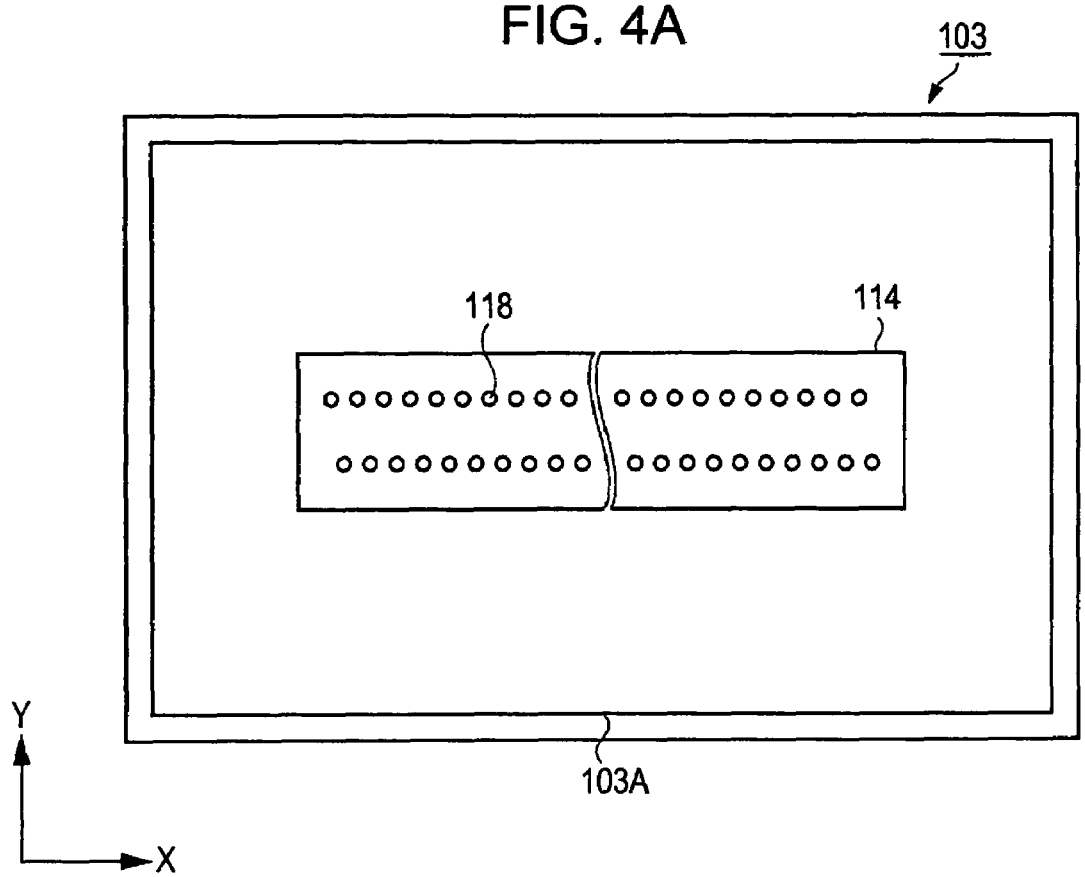
FIG. 4A is a schematic diagram showing the head in a discharge head unit of the droplet discharge device.
Figure 4B:
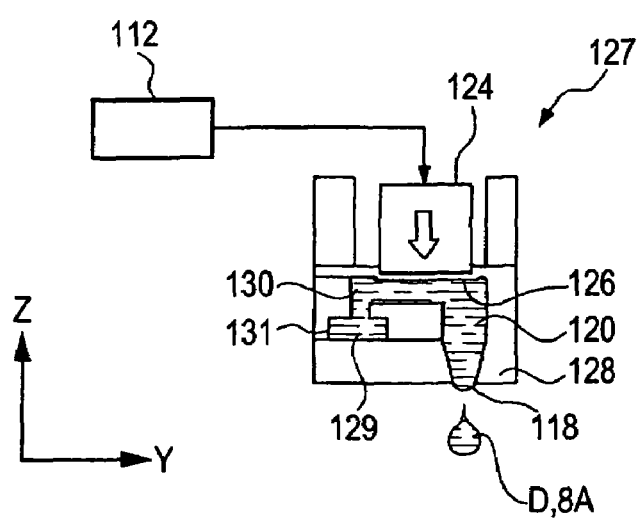
FIG. 4B is a schematic diagram showing a discharge unit in the head.

The head 114 will now be described in detail. As shown in FIG. 4A, the head 114 is an inkjet head having a plurality of the nozzles 118. Further, the head 114 is fixed by a carriage 103A in the discharge head unit 103. As shown in FIG. 4B, the head 114 includes a vibration plate 126 and a nozzle plate 128 that defines the apertures of the nozzles 118. Further, a liquid reservoir 129 is located between the vibration plate 126 and the nozzle plate 128. The liquid reservoir 129 is always filled with the conductive material 8A supplied from an external tank (not shown) through a hole 131.

Further, a plurality of partition walls is disposed between the vibration plate 126 and the nozzle plate 128. Furthermore, a portion surrounded by the vibration plate 126, the nozzle plate 128 and the pair of partition walls is a cavity 120. Since the cavity 120 is formed corresponding to each of the nozzles 118, the number of cavities 120 is the same as the number of nozzles 118. The cavity 120 is supplied with the conductive material 8A from the liquid reservoir 129 through a supply port 130 disposed between a pair of the partition walls. Further, in the present embodiment, the diameter of the nozzles 118 is about 27 μm.

Further, each of the oscillators 124 is disposed on the vibration plate 126 corresponding to each of the cavities 120. Each of the oscillators 124 includes a piezoelectric element and a pair of electrodes with the piezoelectric element therebetween. If the control system 112 applies a driving voltage between a pair of the electrodes, a droplet D of the conductive material 8A is discharged from a corresponding nozzle 118. In this case, the volume of the material discharged from the nozzle 118 can vary between 0 pl and 42 pl (pico liter). Further, the volume of the droplet D can be changed by varying a waveform of a driving voltage (a so-called variable dot technology). In addition, the shape of the nozzles 118 can be adjusted such that the droplets D of the conductive material 8A can be discharged from the nozzles 118 in the Z-axis direction.

In the present specification, a portion including one nozzle 118, the cavity 120 corresponding to the nozzle 118, and the oscillator 124 corresponding to the cavity 120 will also be referred to as a "discharge unit 127". According to this reference, one head 114 has the discharge units 127 whose number is the same as that of the nozzles 118. The discharge unit 127 may have an electrothermal conversion element instead of the piezoelectric element. In other words, the discharge unit 127 may be constructed to discharge a material using thermal expansion of the material by the electrothermal conversion element. In this case, the discharge method employing the piezoelectric element is advantageous in that it rarely affects the composition of a material in a liquid phase because it does not apply heat to the material in a liquid phase.

(D. Control System)

Figure 5:
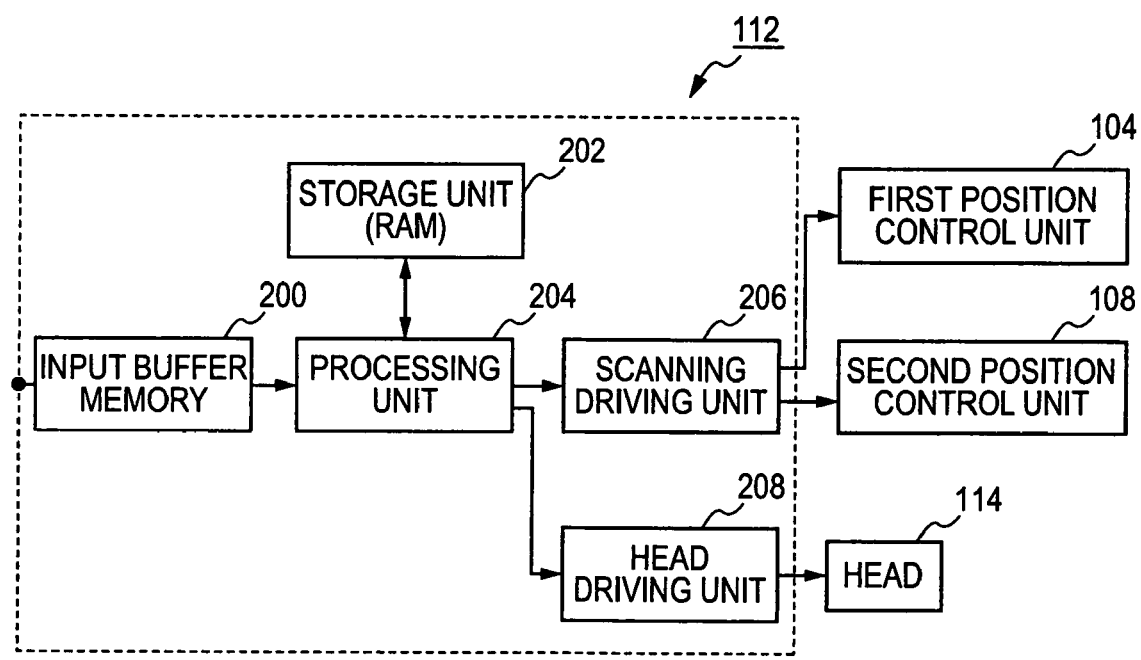
FIG. 5 is a schematic diagram showing a control system in the droplet discharge device.

The construction of the control system 112 will be described below. Referring to FIG. 5, the control system 112 includes an input buffer memory 200, a storage unit 202, a processing unit 204, a scan driving unit 206 and a head driving unit 208. The input buffer memory 200 and the processing unit 204 are communicably connected to each other. The processing unit 204, the storage unit 202, the scan driving unit 206 and the head driving unit 208 are communicably connected to each other through buses (not shown).

The scan driving unit 206 is communicably connected to the first position control unit 104 and the second position control unit 108. In a similar manner, the head driving unit 208 is communicably connected to the head 114.

The input buffer memory 200 receives discharge data for discharging the droplets D of the conductive material 8A from an external information processing unit (not shown), which is located outside the droplet discharge device 100. The input buffer memory 200 supplies the discharge data to the processing unit 204. The processing unit 204 stores the discharge data in the storage unit 202. In FIG. 5, the storage unit 202 can be a RAM.

The processing unit 204 supplies the scan driving unit 206 with data indicating the position of each nozzle 118 relative to a target discharge portion on the basis of the discharge data stored in the storage unit 202. The scan driving unit 206 supplies the second position control unit 108 with a stage driving signal depending upon the discharge data and a discharge cycle. As a result, the position of the discharge head unit 103 relative to the target discharge portion changes. Meanwhile, the processing unit 204 applies a discharge signal necessary for the discharge of the conductive material 8A to the head 114 based on the discharge data stored in the storage unit 202. As a result, the droplet D of the conductive material 8A is discharged from a corresponding nozzle 118 in the head 114.

The control system 112 is a computer having a CPU, a ROM, a RAM and buses. Due to this, the above-described functions of the control system 112 can be implemented using software programs that are executed by the computer. It is to be understood that the control system 112 can be implemented using a dedicated circuit (hardware).

(E. Manufacturing Method)

A method of forming wiring patterns, which is performed by the device manufacturing apparatus 1, will now be described. The method of forming wiring patterns according to the present embodiment is implemented by means of the process of forming a plurality of the gate wiring lines 34 in an element-side substrate 10B (FIG. 13) of the liquid crystal display device. In this connection, the method of forming wiring patterns according to the present embodiment is a part of the method of manufacturing a liquid crystal display device.

(E1. Bank Layer)

Figure 6A:
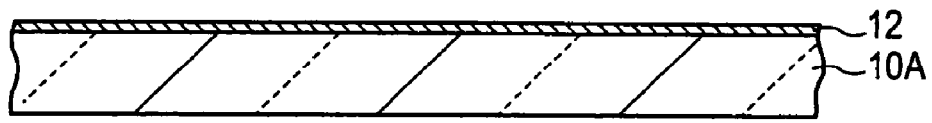
FIGS. 6A to 6D are views for explaining a method of forming the bank pattern according to the first to third embodiments.

Referring first to FIG. 6A, a surface reforming treatment is performed on the entire surface of the substrate 10A having optical transparency. In the present embodiment, the substrate 10A is a glass substrate. Further, the surface reforming treatment is a HMDS treatment. At this time, the HMDS treatment is a treatment of coating hexamethyldisilazane $((CH_3)_3SiNHSi(CH_3)_3)$ on a surface of an object in the form of vapor. Through the HMDS treatment, a HMDS layer 12 is formed on the substrate 10A. A bank pattern 18 (FIG. 7D) is formed on the HMDS layer 12 thereafter. Further, the HMDS layer 12 can be adhered to the bank layer 18 as well as the substrate 10A. For this reason, the HMDS layer 12 serves as an adhesion layer that bonds the bank pattern 18 and the substrate 10A together.

Figure 6B:
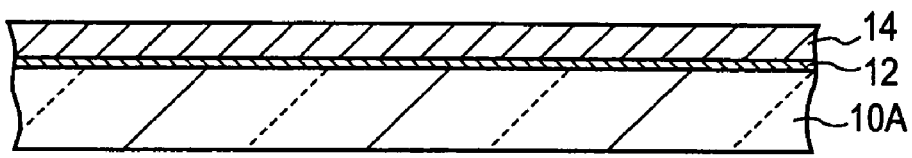

Thereafter, an organic photoresist material is coated on the HMDS layer 12 by means of a spin coating method. At this time, the organic photoresist material is coated so that the bank pattern 18 to be described below has a predetermined thickness (height). The coated organic photoresist material is then hardened by irradiating light, thus forming an organic photoresist material layer 14 as shown in FIG. 6B. In the present embodiment, the organic photoresist material layer 14 has a thickness of about 1 μm.

Here, the organic photoresist material of the present embodiment is acrylic resin. It is to be noted that a polymeric material such as polyimide resin, olefinic resin, phenolic resin or melamine resin instead of acrylic resin, may be used to form the organic photoresist material layer 14. Further, the organic photoresist material may be coated on the HMDS layer 12 by means of one of spray coating, roll coating, die coating and dip coating, instead of the above-descried spin coating method.

Figure 6C:
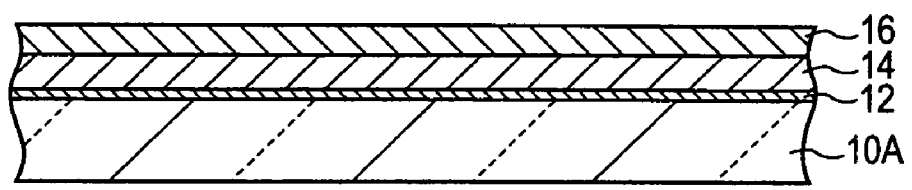
Figure 6D:
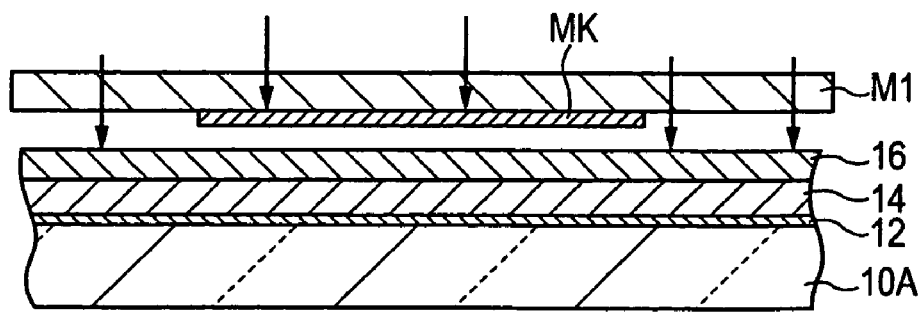
Figure 7A:
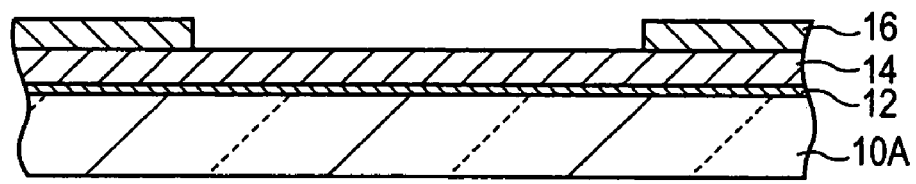
FIGS. 7A to 7D are views for explaining a method of forming a bank pattern according to the first and second embodiments.
Figure 7B:
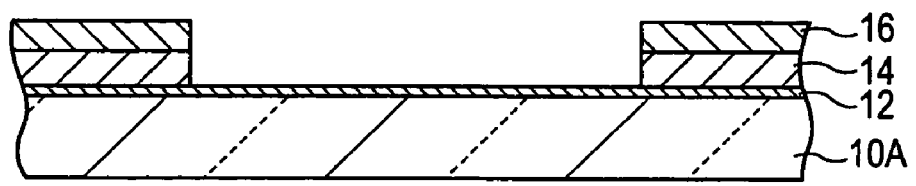
Figure 7C:
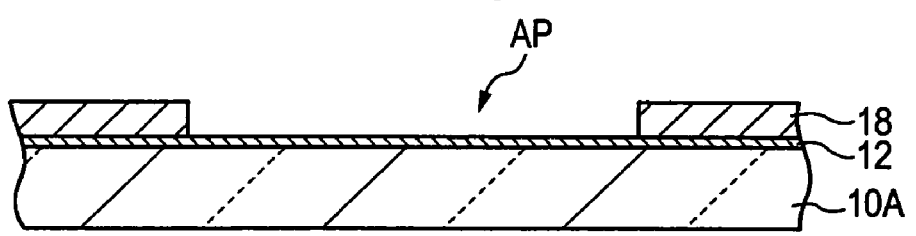

Referring to FIG. 6C, a negative type photoresist is coated on the organic photoresist material layer 14, and a photoresist layer 16 is then formed thereon. Referring to FIG. 6D, the photoresist layer 16 is exposed through a photo mask M1 in which a portion corresponding to a two-dimensional shape of a wiring pattern is covered with a light-shielding mask MK. Thereafter, referring to FIG. 7A, the exposed photoresist layer 16 is developed. As shown in FIGS. 7B and 7C, the organic photoresist material layer 14 is partially etched, and the photoresist layer 16 that remains after the etching is then stripped. The bank pattern 18 is thus obtained from the organic photoresist material layer 14.

The bank pattern 18 borders the two-dimensional shape of the wiring pattern. Further, the bank pattern 18 serves as a partition member in a subsequent discharge process. In addition, since the organic-based photoresist material constituting the bank pattern 18 is acrylic resin, the bank pattern 18 has optical transparency. In this case, the bank pattern 18 may be formed by means of a printing method (so-called complete additive process), instead of a patterning method by photolithography. The bank pattern 18 may be formed by any method only if the bank pattern 18 borders the two-dimensional shape of the wiring pattern.

In this case, the two-dimensional shape of the wiring pattern is almost the same as that of a bottom surface (i.e., a portion that touches the substrate 10A) of the wiring pattern.

Further, any materials having a main chain of an inorganic skeleton (siloxane bond) and an organic group may be used as the material of the bank pattern 18. In addition, the bank pattern 18 (a convex portion) may have a structure of two or more layers in which a lower layer is made of an inorganic substance and an upper layer is made of an organic substance. In addition, the photoresist layer 16 may remain on the bank pattern 18 without being stripped.

The bank pattern 18 has a plurality of apertures AP through which the HMDS layer 12 formed on the substrate 10A is exposed. Further, the shape of each of the plurality of apertures AP is substantially identical to the two-dimensional shape of each of the plurality of gate wiring lines 34. In other words, in the present embodiment, the bank pattern 18 has a shape that completely surrounds the circumference of each of the plurality of gate wiring lines 34 to be formed later.

It is to be understood that the bank pattern 18 may have a plurality of banks 18B (FIG. 8), which are separated from each other. For example, the bank pattern 18 may be separated from each other by a predetermined distance, and can be bordered by the two-dimensional shape of one gate wiring line 34 between a pair of the banks 18B, which are substantially parallel to each other. In this case, the banks 18B may not exist at portions corresponding to both ends of the gate wiring line 34. That is, it is not necessary for the bank pattern 18 to completely surround the circumference of the two-dimensional shape of the gate wiring line 34.

Further, the width at the top of the aperture AP is preferably greater than that at the bottom of the aperture AP (on the side of the substrate 10A). This is because the droplet D of the conductive material 8A can be spread easier.

Figure 7D:
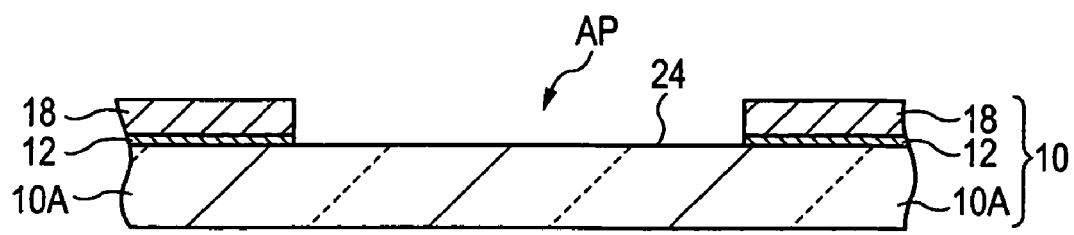

After the bank pattern 18 is formed on the HMDS layer 12, a hydrofluoric acid treatment is performed on the substrate 10A. The hydrofluoric acid treatment is a treatment of etching the HMDS layer 12 using, e.g., a 2.5% aqueous fluorinated acid solution. In this case, since the bank pattern 18 serves as a mask, the HMDS layer 12 at the bottom of the apertures AP is removed, thereby exposing the substrate 10A, as shown in FIG. 7D. In the present embodiment, the surface of the substrate 10A, which is exposed at the bottom of the aperture AP, becomes the "pattern formation region 24".

As such, a plurality of the pattern formation regions 24 having the two-dimensional shape is formed on the substrate 10A, by means of the bank pattern 18. A conductive layer 8 (the gate wiring line 34 of FIG. 1) is formed in each of the plurality of pattern formation regions 24 by means of a discharge process that will be described below. Further, in the present embodiment, the substrate 10A after the plurality of pattern formation regions 24 corresponds to the base 10 (FIG. 3).

Meanwhile, the plurality of pattern formation regions 24 has all the same shape. In addition, in each of the pattern formation regions 24, portions (this is also referred to as "segment") having the same shape repeatedly appear. By taking a part of one pattern formation region 24 into consideration, the method of forming a wiring pattern will be described below.

The pattern formation region 24 shown in FIG. 8 includes a first region 24A having a width w1, and second regions 24B, 24C and 242D, which touch the first region 24A and have a width w2 smaller than the width w1. In this case, the first region 24A is a portion of the pattern formation region 24 that extends in a first direction. Further, the first region 24A in the pattern formation region 24 is a portion where the broad portion 34A is formed in a subsequent process. Meanwhile, the second regions 24B, 24C and 24D in the pattern formation region 24 are portions where the narrow portion 34B, 34C and 34D are respectively formed in a subsequent process. The width w1 of the first region 24A is almost the same as that of the broad portion 34A (i.e., about 20 μm). Meanwhile, the width w2 of the second regions 24B, 24C and 24D is almost the same as that of the narrow portions 34B, 34C and 34D (i.e., about 10 μm).

(E2. Lyophilic Treatment Process)

A lyophilic treatment process in which the pattern formation regions 24 is given a lyophilic property is then performed. The lyophilic treatment process may employ an ultraviolet (UV) radiation treatment of radiating UV light, an $O_2$ plasma treatment using oxygen as a treatment gas in the atmosphere, or the like. In the present embodiment, the $O_2$ plasma treatment is carried out.

The $O_2$ plasma gas treatment is a treatment in which a plasma discharge electrode (not shown) radiates oxygen of a plasma state to the substrate 10A (the base 10). As exemplary conditions for the $O_2$ plasma treatment, plasma power is 50 to 1000 W, the flow rate of the oxygen gas is 50 to 100 mL/min, the moving speed of the base 10 relative to the plasma discharge electrode is 0.5 to 10 mm/sec, and the temperature of the base is 70 to 90° C.

In this case, it is preferred that the lyophilic treatment process (in this case, $O_2$ plasma treatment) is performed on the pattern formation region 24 such that a contact angle of the conductive material 8A in a liquid phase on the pattern formation region 24 is below 20 degrees. Where the substrate 10A is the glass substrate as in the present embodiment, the surface of the substrate 10A has some degree of the lyophilic property to the conductive material 8A in a liquid phase. In this case, the lyophilic treatment process may not be performed. Even though the $O_2$ plasma treatment or the UV radiation treatment is performed, the photoresist that may remain on the pattern formation region 24 or residual debris of the HMDS layer can be completely removed. It is thus preferable that the lyophilic treatment process is performed. Further, the lyophilic treatment process can be a process in which the $O_2$ plasma treatment and the UV radiation treatment are combined together.

As such, since the HMDS layer 12 on the pattern formation region 24 is sufficiently removed through the $O_2$ plasma treatment or the UV radiation treatment, there is a case where the removal of the HMDS layer 12 may not be performed by means of the above-described hydrofluoric acid treatment. Even though, if the aforementioned hydrofluoric acid treatment and the lyophilic treatment process are carried out, the HMDS layer 12 on the pattern formation region 24 can be certainly removed. Therefore, it is preferable to perform the hydrofluoric acid treatment and the lyophilic treatment process.

(E3. Liquid-Repellant Treatment Process)

A liquid-repellant treatment process is then performed on the surface of the bank pattern 18, and a liquid-repellant property is given to a surface of the bank pattern 18. The liquid-repellant treatment process can adopt a plasma treatment method (a $CF_4$ plasma treatment method) using $CF_4$ carbon (tetrafluoromethane) as a treatment gas. As conditions of the $CF_4$ plasma treatment, for example, plasma power is 50 to 1000 W, the flow rate of a $CF_4$ carbon gas is 50 to 100 mL/min, the carrying rate of a base with respect to a plasma discharge electrode is 0.5 to 1020 mm/sec, and the temperature of a base is 70 to 90° C. Further, the treatment gas may include other fluorocarbon-based gases or gases such as $SF_6$ or $SF_5CF_3$ instead of tetrafluoromethane.

By performing the liquid-repellant treatment process, a fluoric group is introduced into resin constituting the bank pattern 18, and the high liquid-repellant property is thus imparted to the surface of the bank pattern 18. Moreover, the $O_2$ plasma treatment as the lyophilic treatment process may be performed before the formation of the bank pattern 18. In this case, however, acrylic resin, polyimide resin, etc. have a property that they are easily fluorinated (a liquid-repellant property) when undergoing a pre-treatment using $O_2$ plasma. Accordingly, it is preferred that the $O_2$ plasma treatment is performed after the bank pattern 18 is formed.

A surface of the pattern formation region 24 can substantially maintain the lyophilic property which has already been given although it undergoes the liquid-repellant treatment process performed on the bank pattern 18. In particular, since the substrate 10A of the present embodiment is the glass substrate, the fluoric group is not introduced into the surface (the pattern formation region 24) of the substrate 10A even if the substrate 10A undergoes the liquid-repellant treatment process. Thus, the lyophilic property of the pattern formation region 24, e.g., wettability is not affected.

In the present embodiment, after the liquid-repellant treatment process is performed on the bank pattern 18, the hydrofluoric acid treatment is again performed on the bottom portion (the pattern formation region 24) of the aperture AP. By doing so, the surface (glass) of the substrate 10A is exposed at the bottom of the aperture AP very well. Consequently, the lyophilic property at the bottom of the aperture AP can be sustained easily.

The liquid-repellant property on the surface of the bank pattern 18 becomes higher than the liquid-repellant property on the pattern formation region 24 through the lyophilic treatment process and the liquid-repellant treatment process. In the present embodiment, the pattern formation region 24 has more like the lyophilic property. Further, as described above, since the substrate 10A of the present embodiment is made of glass, the fluoric group is not introduced into the pattern formation region 24 even if the $CF_4$ plasma treatment is performed. Due to this, although only the $CF_4$ plasma treatment (the liquid-repellant treatment process) is performed without carrying out the $O_2$ plasma treatment (the lyophilic treatment process), the liquid-repellant property on the surface of the bank pattern 18 becomes higher than the liquid-repellant property on the pattern formation region 24. As described above, however, since there are advantages that the residual debris on the pattern formation region 24 is completely removed and the bank pattern 18 becomes easily fluorinated, the $O_2$ plasma treatment is not omitted in the present embodiment.

Furthermore, one of indices indicating the liquid-repellant property of an object surface is a contact angle, which is shown by a material in a liquid phase on the object surface. As the contact angle shown by the material in a liquid phase on the object surface is small, the object surface has a higher lyophilic property to the material in a liquid phase. In the present embodiment, the contact angle shown by the conductive material 8A on the pattern formation region 24 is 20 degrees or less.

(E4. Discharge Process)

After the surface reforming treatment (the lyophilic treatment process) is performed on the pattern formation region 24, the conductive material layer 8B covering the pattern formation region 24 is formed. Details thereof are as follows.

First, the base 10 in which the plurality of pattern formation regions 24 is formed is positioned on the stage 106 of the droplet discharge device 100. As a result, a surface of each of the plurality of pattern formation regions 24 becomes parallel to the X-axis direction and the Y-axis direction. Moreover, in the present embodiment, the substrate 10A is positioned on the stage 106 such that the first direction (i.e., the direction in which the first region 24A extends) coincides with the X-axis direction.

Figure 9A:
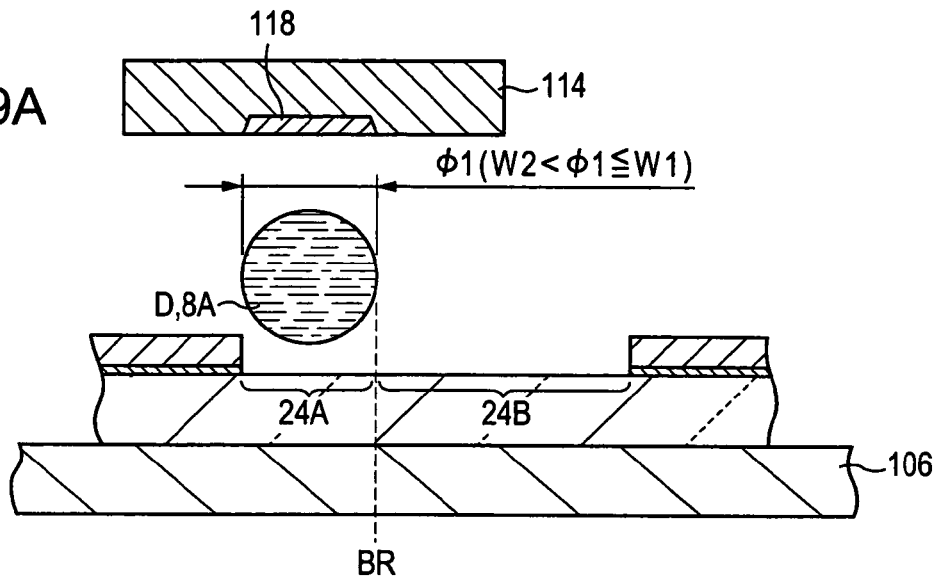
FIGS. 9A to 9D are schematic diagrams for explaining a discharge process according to the first and second embodiments.
Figure 9B:
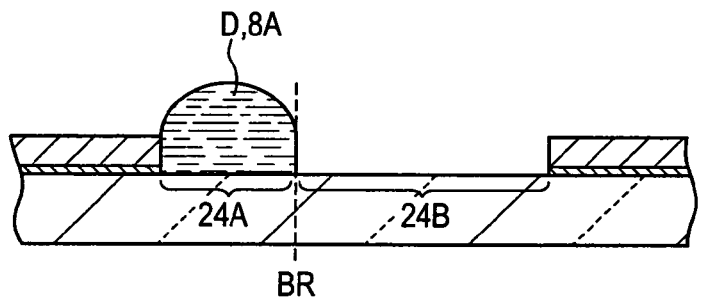
Figure 9C:
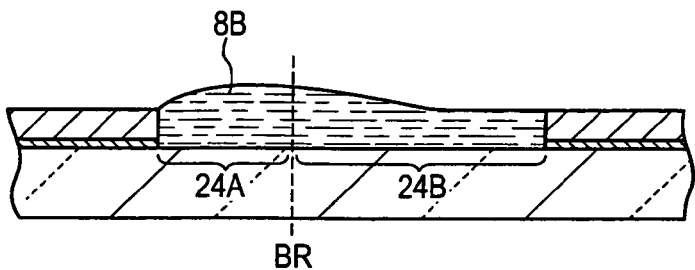

Further, the droplet discharge device 100 discharges a plurality of droplets D toward the first region 24A based on discharge data corresponding to a wiring pattern. The conductive material layer 8B covering the pattern formation regions 24 is thus obtained. To be more specific, the droplet discharge device 100 changes a position of the nozzle 118 relative to the substrate 10A in a two-dimensional way (the X-axis direction and the Y-axis direction). As shown in FIG. 9A, whenever the nozzle 118 reaches a position corresponding to the first region 24A, a droplet D of the conductive material 8A is discharged from the nozzle 118. Consequently, a plurality of droplets D of the conductive material 8A lands in the first region 24A and then spreads, as shown in FIG. 9B. As shown in FIG. 9C, as the plurality of droplets D landed in the first region 24A spreads, the conductive material layer 8B that covers not only the first region 24A but also the second regions 24B, 24C and 24D is formed.

Figure 9D:
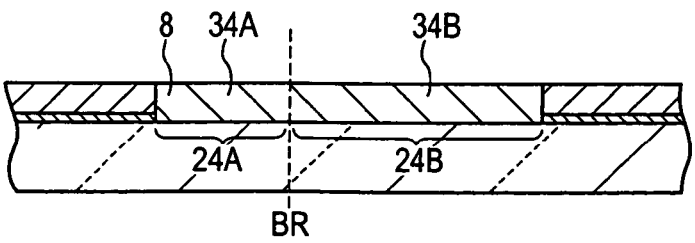

In this case, the volume and the number (dot) of droplets D are set in the discharge data such that the thickness of the conductive layer 8 (FIG. 9D), which is obtained after an activation process to be described below, becomes about 1 μm. Further, the cross sections shown in FIGS. 9A to 9D correspond to those taken along the line IX-IX in FIG. 8.

In addition, in the present embodiment, though the nozzle 118 reaches positions corresponding to the second regions 24B, 24C and 24D, the droplet discharge device 100 does not discharges any droplets D of the conductive material 8A. Due to this, the droplets D from the nozzles 118 never land in the second regions 24B, 24C and 24D.

Instead, the droplet discharge device 100 discharges the droplets D so that the droplets D having a diameter φ1 land at a position that faces a boundary line BR between the first region 24A and the second region 24B (24C or 24D). The position that faces the boundary line BR corresponds to one of the following 1), 2) or 3):

1) Position on a line V (FIG. 10) normal to the boundary line BR. In this case, the normal line V runs through almost the center of the boundary line BR. It is thus preferred that a droplet D discharged toward the position on the normal line V is the first one among droplets that are discharged toward the first region 24A.

2) Position on the normal line V and at a distance of ½ times to 1 times the diameter φ1 of the droplet D from the boundary line BR. The first embodiment falls within this case.

3) Position at a distance of 0 times to 1 times the diameter φ1 from a position PX where the normal line V, and a line segment L (FIG. 10) which divides the first region 24A into two intersect. In this case, the line segment L extends in a direction orthogonal to the direction of the first width w1. That is, the line segment L is parallel to a longitudinal direction of the first region 24A.

If the droplet discharge device 100 discharges droplet D in such a way that the center of the droplet D touches a position such as position 1), the droplet D that lands in the first region 24A is likely to touch inlets EN of the second regions 24B, 24C and 24D. In particular, if the droplet discharge device 100 discharges the droplet D in such a manner that the center of the droplet D touches position 2), the droplet D touches the inlets EN of the second regions 24B, 24C and 24D almost simultaneously with a time when the droplet D lands in the first region 24A. Further, although the droplet discharge device 100 discharges a droplet D so that the center of the droplet D touches a position such as position 3), the droplet D can touch the inlets EN of the second regions 24B, 24C and 24D since the landed droplet D spreads.

Furthermore, the diameter φ1 of the droplet D is smaller than the width w1 of the first region 24A, but is greater than the width w2 of the second regions 24B, 24C and 24D.

By discharging the droplet D as described above, the conductive material 8A in a liquid phase, which is dropped on the first region 24A, flows into the second region 24B (or 24C and 24D) beyond the boundary line BR between the first region 24A and the second region 24B (or 24C and 24D) by way of self-flowing (a capillary phenomenon), as shown in FIG. 9C. As a result, the conductive material layer 8B is also formed on the second region 24B (or 24C and 24D). In the event that the conductive material layer 8B covering the entire surface of the second region 24B (or 24C and 24D) cannot be formed only through the volume of one droplet D since the length of the second region 24B (or 24C and 24D) is long, a plurality of droplets D can be discharged from the nozzle 118 in such a manner that the plurality of droplets D lands in almost the same position that faces the boundary line BR. At this time, the nozzle 118 used to discharge the plurality of droplets D toward the same position can be of the same one nozzle 118 or a plurality of different nozzles 118.

Hereinafter, the discharge method of the present embodiment will be described in more detail by taking notes of one first region 24A, and three second regions 24B, 24C and 24D that touch one first region 24A.

As shown in FIG. 10, a longitudinal direction of the first region 24A is parallel to the X-axis direction. Further, the first region 24A touches the three second regions 24B, 24C and 24D with the boundary line BR therebetween. In this case, the second regions 24C and 24D are located at both ends of the first region 24A extending in the X-axis direction. Further, the second region 24B protrudes from the middle of the first region 24A in the Y-axis direction. Further, the second region 24B is provided with the narrow portion 34B (FIG. 1), e.g., the gate electrode 44G.

As shown in FIGS. 10 and 12, ten landing positions CP (CP1 to CP10 in the drawings) are allocated to one first region 24A in the discharge data. In FIGS. 10 and 12, white circles showing the ten landing positions overlap each other in the first region 24A. Further, the droplet discharge device 100 discharges the droplet D to the ten landing positions CP in the order of CP1 to CP10 on the basis of the discharge data. At this time, numbers following reference numeral "CP" indicate the order that the droplets D are discharged in one first region 24A. Further, in FIGS. 10 and 12, the landing positions CP are lined up in the order of CP1, CP6, CP2, CP7, CP3, CP8, CP4, CP9, CP5 and CP10 from a negative direction of the X-axis direction to a positive direction thereof (from the left side to the right side on the page).

Furthermore, the diameter of the droplets D discharged toward the landing positions CP1, CP2 and CP10 is $\phi 1$; $\phi 1$ is almost the same as the width w1 of the first region 24A, but is greater than the width w2 of the second region. Meanwhile, the diameter of the droplets D discharged toward the landing positions CP3, CP4, CP5, CP6, CP7, CP8 and CP9 is $\phi 2$ which is smaller than $\phi 1$. The diameter $\phi 2$ is however greater than the width w2 of the second region. In this case, if not otherwise mentioned, the term "the diameter of the droplet D" refers to the diameter of a projected image of the droplet D that is projected on a virtual plane defined in the X-axis direction and the Y-axis direction. Further, the diameters $\phi 1$ and $\phi 2$ of the droplet D depend upon the volume of the conductive material 8A to be discharged.

Meanwhile, before a first scanning interval begins, the droplet discharge device 100 relatively moves the discharge head unit 103 in the X-axis direction, and makes the X coordinate of one nozzle 118 coincide with the X coordinate of a landing position CP1. If the first scanning interval begins, the droplet discharge device 100 changes the position of the nozzle 118 relative to the substrate 10A in a positive direction of the Y-axis direction. If the nozzle 118 reaches a position corresponding to the landing position CP1 within the first scanning interval, the droplet discharge device 100 discharges a droplet D of the conductive material 8A from the nozzle 118. By doing so, the droplet D of the conductive material 8A lands in (collides against) the landing position CP1, and spreads from the landing position CP1 to the circumference thereof. As a result, the conductive material 8A is coated on or applied to the landing position CP1 and the circumference thereof.

Figure 11:
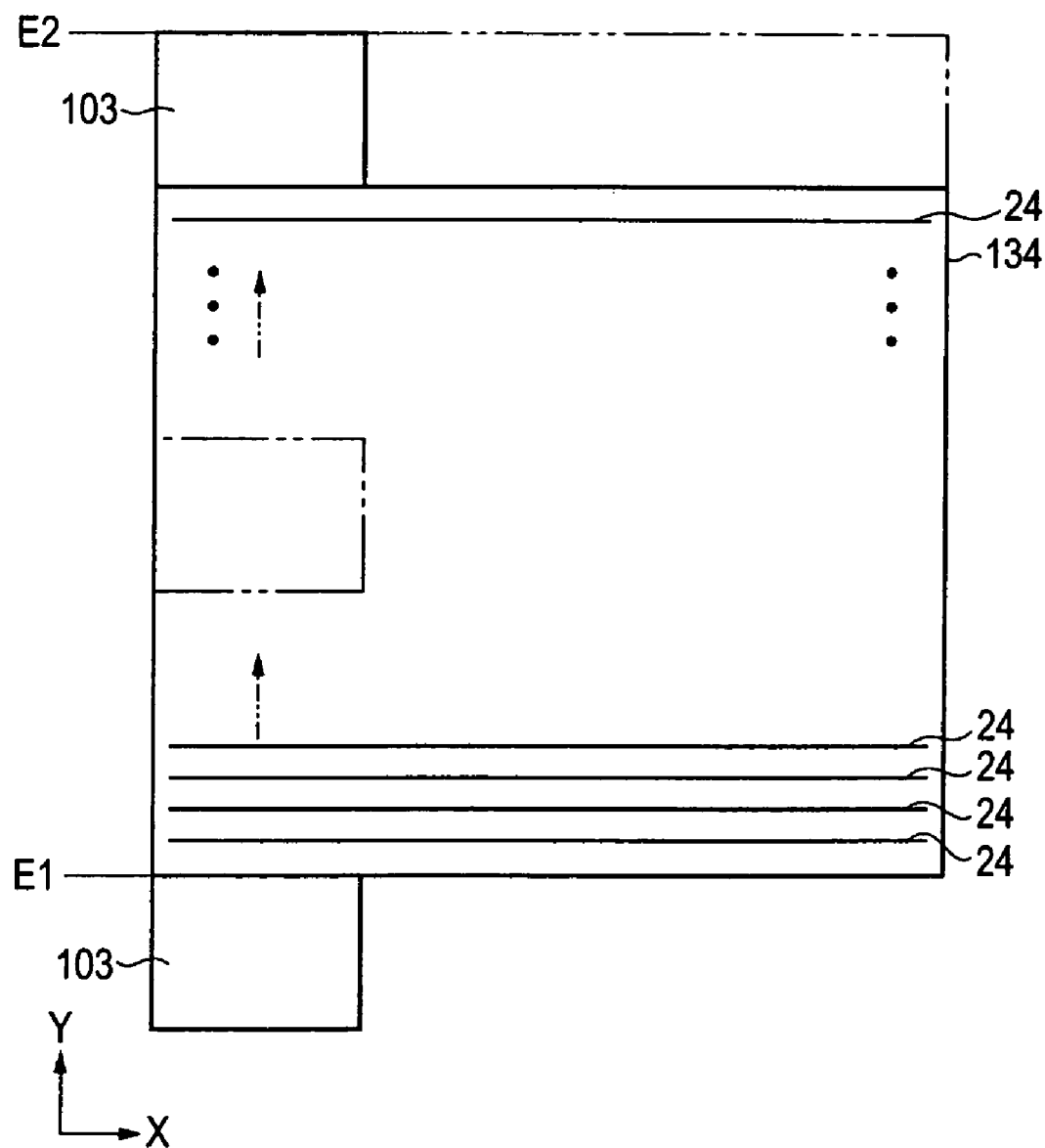
FIG. 11 is a schematic diagram explaining a scanning interval and a scanning range.

In the present embodiment, meanwhile, the term "scanning interval" refers to an interval where one side of the discharge head unit 103 relatively moves only once from one end E1 (or the other end E2) of a scanning range 134 to the other end E2 thereof (or one end E1) along the Y-axis direction, as shown in FIG. 11. In this case, the scanning range 134 refers to a range where one side of the discharge head unit 103 relatively moves until the conductive material 8A is coated on or applied to all of the plurality of pattern formation regions 24 in the base 10. It is to be understood that the "scanning range" can refer to the range where one nozzle 118 relatively moves or the range where one head 114 relatively moves, if needed.

Further, what the discharge head unit 103, the head 114 or the nozzle 118 moves in a relative way, means that the position thereof relative to the pattern formation region 24 changes. For this reason, this applies to a case where the discharge head unit 103, the head 114 or the nozzles 118 is absolutely stopped and only the base 10 is moved by means of the stage 106, it can be said that the discharge head unit 103, the head 114 or the nozzles 118 moves in a relative manner.

If the first scanning interval finishes, the droplet discharge device 100 relatively moves the discharge head unit 103 in the X-axis direction, and makes the X coordinate of one nozzle 118 coincide with the X coordinate of a landing position CP2. If a second scanning interval begins, the droplet discharge device 100 varies a position of the nozzle 118 relative to the substrate 10A in a negative direction of the Y-axis direction. Further, if the nozzle 118 reaches a region corresponding to the landing position CP2 within the second scanning interval, the droplet discharge device 100 discharges a droplet D of the conductive material 8A from the nozzle 118. Accordingly, the droplet D of the conductive material 8A lands in (collides against) the landing position CP2, and then spread from the landing position CP2 to the circumference thereof. As a result, the conductive material 8A is coated on or applied to the landing position CP2 and the circumference thereof.

As shown in FIG. 10, the landing position CP1 faces the boundary line BR corresponding to the second region 24C. Due to this, upon the droplet D lands in the landing position CP1, it faces the inlet EN to the second region 24C, and two sides of the bank pattern 18 that borders the inlet EN. In a similar manner, the landing position CP2 faces the boundary line BR corresponding to the second region 24B. Due to this, upon the droplet D lands in the landing position CP2, it faces the inlet EN to the second region 24B, and two sides of the bank pattern 18 that borders the inlet EN. As a result, most of the volume of the droplet D flows into the second regions 24B and 24C, rather than spreading on the first region 24A. This is because the width w2 of each of the second regions 24B and 24C or the width of the inlet EN is smaller than the width w1 of the first region 24A.

Accordingly, although the droplet D is not discharged toward the second regions 24B and 24C, the conductive material 8A can be introduced into the second regions 24B and 24C from the first region 24A. It is thus possible to form the conductive material layer 8B covering the second regions 24B and 24C. In particular, since it is not necessary to discharge the droplet D toward the second region 24B (a portion where the gate electrode 44G will be formed), there is no possibility that the conductive material 8A may be adhered outside the second region 24B. That is, residual debris of the conductive material 8A does not remain. It is therefore possible to obtain the conductive material layer 8B having a shape that exactly reflects the two-dimensional shape of the second region 24B. As a result, the gate electrode 44G that is finally obtained has a gate width and a gate length which do not include an error incurred by a discharge process.

In the same manner as the first and second scanning intervals, in each of third to fifth scanning intervals, the droplet discharge device 100 discharges each droplet D toward each of the landing positions CP3, CP4 and CP5 shown in FIG. 10.

(E5. Intermediate Drying Process)

Thereafter, a plurality of droplets D of the conductive material 8A that land in the landing positions CP1 to CP5 is dried using the heater 140, and thus a dispersion medium is removed from the conductive material 8A. This intermediate drying process allows the conductive layer 8, which is finally obtained, to have a predetermined thickness. The heater 140 of the present embodiment can be an infrared (IR) lamp. However, the intermediate drying process can be lamp annealing using a xenon lamp, a YAG laser, an argon laser, a carbon dioxide gas laser, or an excimer laser such as XeF, XeCl, XeBr, KrF, KrCl, ArF or ArCl as a light source, instead of lamp annealing using the IR lamp. These light sources can generally have power ranging from 10 W to 5000 W. In the present embodiment, however, a light source with power of 100 W to 1000 W is sufficient. Further, the intermediate drying process can include drying by using a common hot plate that heats the base 10, an electric furnace, etc., instead of lamp annealing.

After five droplets D that land in the landing positions CP1 to CP5 are dried, the droplet discharge device 100 discharges the droplets D toward the landing positions CP6, CP7, CP8, CP9 and CP10, which are shown in FIG. 12, from one nozzle 118 or a plurality of the nozzles 118 in each of sixth to tenth scanning intervals.

As shown in FIG. 12, the landing position CP10 is a position that faces the boundary line BR between the first region 24A and the second region 24D. Therefore, by discharging the droplet D to the landing position CP10 and landing the droplet D at the position CP10, the conductive material 8A in a liquid phase can also be introduced into the second region 24D from the first region 24A similar to the second regions 24B and 24C. As a result, the conductive material layer 8B covering the second region 24D can be formed without discharging any droplet D toward the second region 24D.

As such, by landing the ten droplets D of the conductive material 8A in the first region 24A, the conductive material layer 8B that covers not only the first region 24A but also the three second regions 24B, 24C and 24D facing the first region 24A can be formed.

(E6. Activation Process)

After the conductive material layer 8B is formed on the entire pattern formation region 24 formed in the base 10, the conductive material layer 8B is activated in order to obtain the conductive layer 8. To be more specific, the conductive material layer 8B is baked (heated) to sinter or fuse silver particles contained in the conductive material layer 8B. In order to perform this process, the carrier device 170 picks up the substrate 10A from the droplet discharge device 100, and then carries it into the clean oven 150. The clean oven 150 then bakes the substrate 10A.

The activation process of the present embodiment is a heating process that is performed in the atmosphere. The heating process may be carried out in an atmosphere of inert gas such as nitrogen, argon or helium, or in a reduction atmosphere such as hydrogen, if appropriate. The processing temperature of the above heating process can be appropriately determined in consideration of a boiling point (vapor pressure) of a dispersion medium, the type and pressure of an ambient gas, thermal behavior such as the dispersibility or oxidizability of silver particles in the conductive material layer 8B, whether a coating agent covering silver particles exists or not, the amount of a coating agent, an upper temperature limit of the substrate 10A, and the like.

In the activation process of the present embodiment, the conductive material layer 8B is baked (heated) in the atmosphere using the clean oven 150 at a temperature of 280 to 300° C. for 300 minutes. At this time, in order to remove organic components from the conductive material layer 8B, the conductive material layer 8B is preferably baked (heated) at a temperature of about 200° C. When a plastic substrate is used instead of the substrate 10A made of glass, however, the conductive material layer 8B is preferably baked (heated) at a temperature higher than room temperature and lower than 250° C.

The activation process may be a process of irradiating UV light to the conductive material layer 8B, instead of the heating process. Further, the activation process may be a process in which the heating process and the UV light irradiation process are combined together.

The above-described processes cause an electrical contact to be established between silver particles in the conductive material layer 8B. As a result, the conductive layer 8 (FIG. 9D), which covers the first region 24A and the second regions 24B, 24C and 24D, can be obtained from the conductive material layer 8B. That is, one broad portion 34A, one narrow portion 34B and two narrow portions 34C and 34D are formed. As mentioned above, the narrow portion 34B is the gate electrode 44G. Further, the thickness of the conductive layer 8 is about 1 μm. Accordingly, the surface of the conductive layer 8 and the surface of the bank pattern 18 form a plane at almost the same level.

In the present embodiment, even after the conductive layer 8 is formed, the bank pattern 18 remains. However, the bank pattern 18 may be removed after the activation process. In order to remove the bank pattern 18, an ashing treatment can be performed on the base 10, the bank pattern 18 may be dissolved in a solvent, or the bank pattern 18 may be removed physically.

An example of the ashing treatment is plasma ashing. Plasma ashing is a process in which a bank layer is vaporized through a reaction between a gas such as oxygen plasma (plasma oxygen gas) and the bank pattern 18, thereby stripping and removing the bank layer. In particular, the bank pattern 18 contains carbon, oxygen and hydrogen. Thus, if the bank pattern 18 chemically reacts with oxygen plasma, $CO_2$, $H_2O$ and $O_2$ are all generated in a gas state. That is, the bank pattern 18 can be stripped from the gas through vaporization.

Another example of the ashing treatment is ozone ashing. The basic principle of ozone ashing is to obtain O+ (oxygen radical) of a reactive gas by decomposing $O_3$ (ozone). Further, $O^+$ and the bank pattern 18 chemically react with each other. Through the chemical reaction, $CO_2$, $H_2O$ and $O_2$ are all generated in a gas state. That is, the bank pattern 18 may be stripped from the gases through vaporization.

(E7. Fabrication of TFT Element)

After the broad portion 34A and the narrow portions 34B, 34C and 34D of the gate wiring line 34 are formed, a thin film transistor (TFT) device is formed. The method of fabricating the TFT element will be described below with reference to FIG. 13 by taking notes of one pixel region.

Figure 13A:
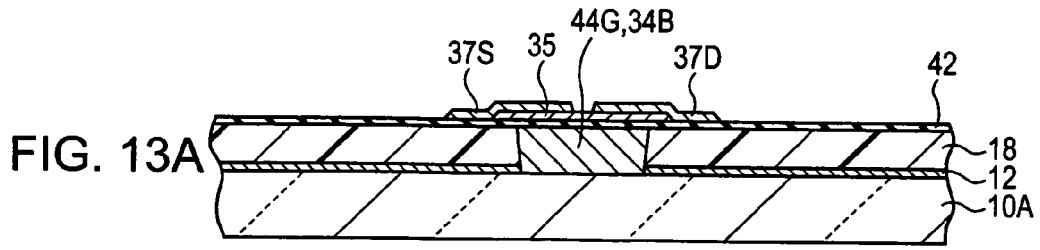
FIGS. 13A to 13E are views for explaining a method of manufacturing a TFT element.

Referring to FIG. 13A, a gate insulating film 42 that covers the gate wiring line 34 and the bank pattern 18, a semiconductor layer 35 formed corresponding to a gate electrode 44G, and two junction layers 37S and 37D which are separated from each other on the semiconductor layer 35 with a predetermined distance therebetween, are formed by means of a chemical vapor deposition (CVD) method and patterning. A thickness of the gate insulating film 42 is approximately 200 nm. The semiconductor layer 35 is be made of amorphous silicon (a-Si) and has a thickness ranging from 200 nm to 300 nm. In this case, a portion where the semiconductor layer 35 overlaps the gate electrode 44G with the gate insulating film 42 therebetween in the semiconductor layer 35 becomes a channel region. Meanwhile, the two junction layers 37S and 37D are made of n+type amorphous silicon, and have a thickness of approximately 50 nm. The two junction layers 37S and 37D are connected to a source electrode 44S and a drain electrode 44D, respectively, which will be formed later.

Figure 13B:
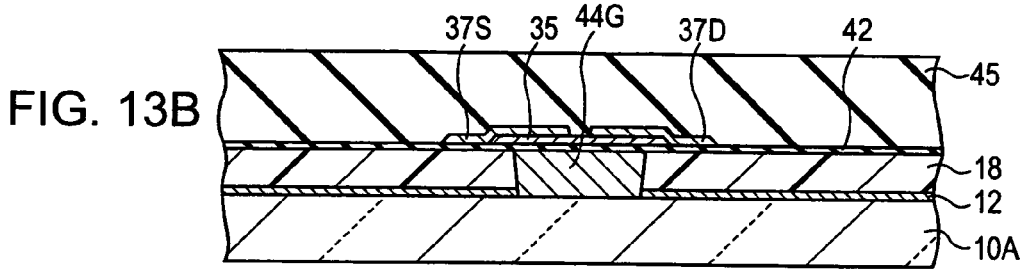

After the two junction layers 37S and 37D are formed, a precursor of polyimide resin is coated to cover the two junction layers 37S and 37D, the semiconductor layer 35 and the gate insulating film 42, by a spin coating method, and is then hardened with light, thereby forming an interlayer insulating layer 45 having a thickness of about 3 µm (3000 nm), as shown in FIG. 13B. At this time, the amount of the coated precursor of polyimide resin is set such that the interlayer insulating layer 45 absorbs a step caused by the semiconductor layer 35 and the two junction layers 37S and 37D. This results in a smooth surface of the interlayer insulating layer 45.

Figure 13C:
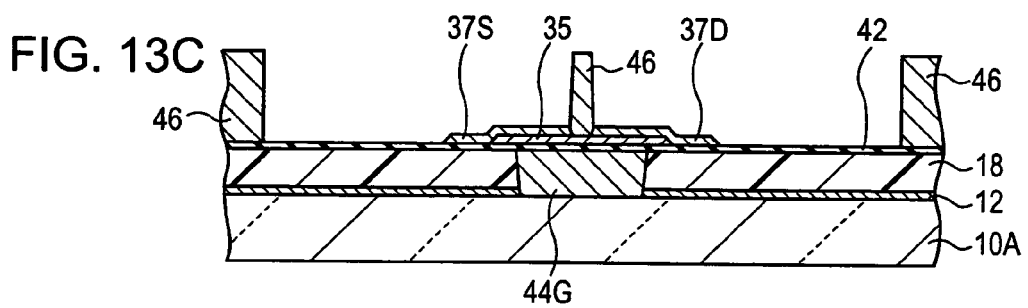

Referring next to FIG. 13C, the interlayer insulating layer 45 is patterned to expose a portion where a source electrode line 44SL is formed, a portion where the source electrode 44S is formed and a portion where the drain electrode 44D is formed. As a result, the interlayer insulating layer 45 is surrounded by the shape of the source electrode line 44SL, the shape of the source electrode 44S and the shape of the drain electrode 44D. Further, the interlayer insulating layer 45 that is patterned thus is also referred to as a "bank pattern 46".

Figure 13D:
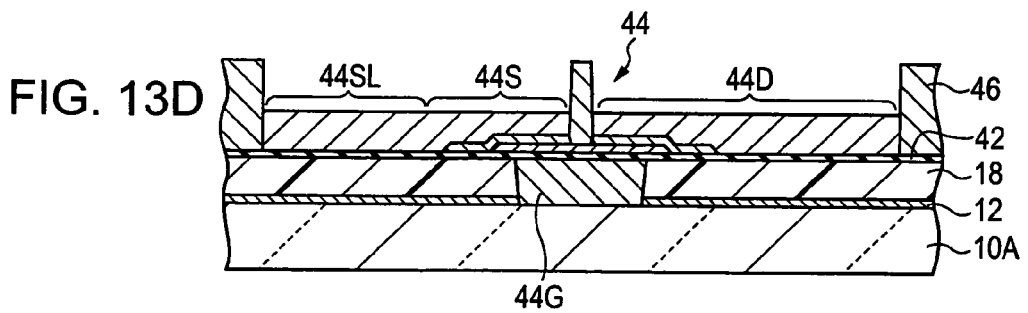

A conductive material layer is then formed in each of the portions surrounded by the bank pattern 46 using the droplet discharge device 100. The conductive material layer is then activated to form the source electrode line 44SL, the source electrode 44S and the drain electrode 44D, as shown in FIG. 13D. In this case, one end of the source electrode 44S is located on the junction layers 37S, and the other end thereof faces the source electrode line 44SL. Further, the drain electrode 44D is located on the junction layer 37D.

In the present embodiment, portions including the gate electrode 44G, the semiconductor layer 35, the gate insulating film 42 located between the gate electrode 44G and the semiconductor layer 35, the junction layer 37S, the source electrode 44S connected to the semiconductor layer 35 via the junction layers 37S, the junction layer 37D, and the drain electrode 44D connected to the semiconductor layer 35 via the junction layer 37D are a TFT element 44.

A second insulating layer 45A that covers the source electrode line 44SL and the source electrode 44S, and a second insulating layer 45B covering the drain electrode 44D are formed by means of photolithography. At this time, the second insulating layers 45A and 45B are formed in such way to absorb the underlying step. By doing so, the second insulating layers 45A and 45B and the bank pattern 46 provide a plane of the same level. In this case, when forming the second insulating layer 45B, a contact hole 45C that reaches the drain electrode 44D through the second insulating layer 45B is also formed. Further, the contact hole 45C has a shape in which the diameter of an aperture of the drain electrode 44D at one side is greater than the diameter of the aperture of the drain electrode 44D at the other side. That is, the contact hole 45C has a tapered shape.

After the second insulating layers 45A and 45B are formed, an ITO film is formed on the second insulating layers 45A and 45B and on the bank pattern 46, and is then patterned, by means of a sputtering method and a known patterning technique. A pixel electrode 36 covering the second insulating layers 45A and 45B and the bank pattern 46 is thus obtained. At the same time, the pixel electrode 36 and the drain electrode 44D are electrically connected through the contact hole 45C to each other.

Figure 13E:
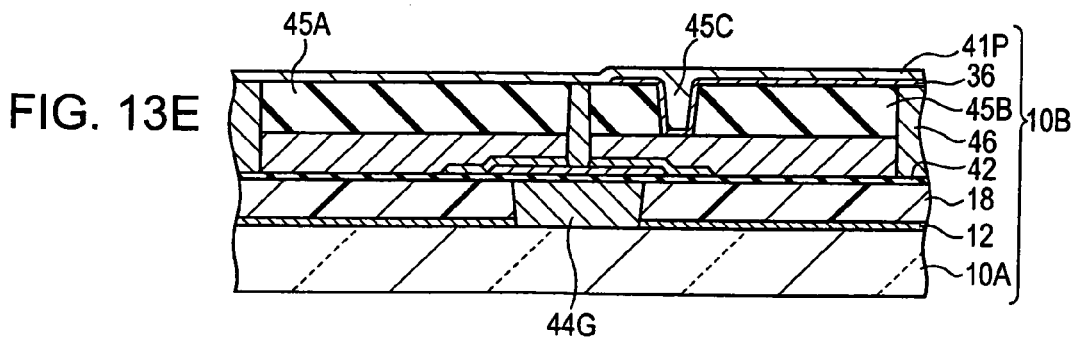

Polyimide resin is then coated and hardened so that it covers the pixel electrode 36, the bank pattern 46, and the second insulating layers 45A and 45B, thereby forming a polyimide resin layer. A surface of the obtained polyimide resin layer is then rubbed in a predetermined direction, obtaining an alignment film 41P. Through the above processes, the element-side substrate 10B as shown in FIG. 13E is thus attained.

Furthermore, the element-side substrate 10B and an opposite substrate (not shown) are adhered together with a spacer (not shown) therebetween. Further, a liquid crystal material is introduced between the element-side substrate 10B and the opposite substrate (not shown), which are secured by a spacer. In this state, the element-side substrate 10B and the opposite substrate are sealed to form a liquid crystal display device.

Second Embodiment

The present embodiment is basically the same as the first embodiment except for the method of discharging a droplet D of the conductive material 8A toward the first region 24A. For this reason, the same reference numerals as those of the first embodiment are used to identify the same elements. Further, description overlapping with the description of the first embodiment will be omitted for the purpose of simplifying the description.

Figure 14:
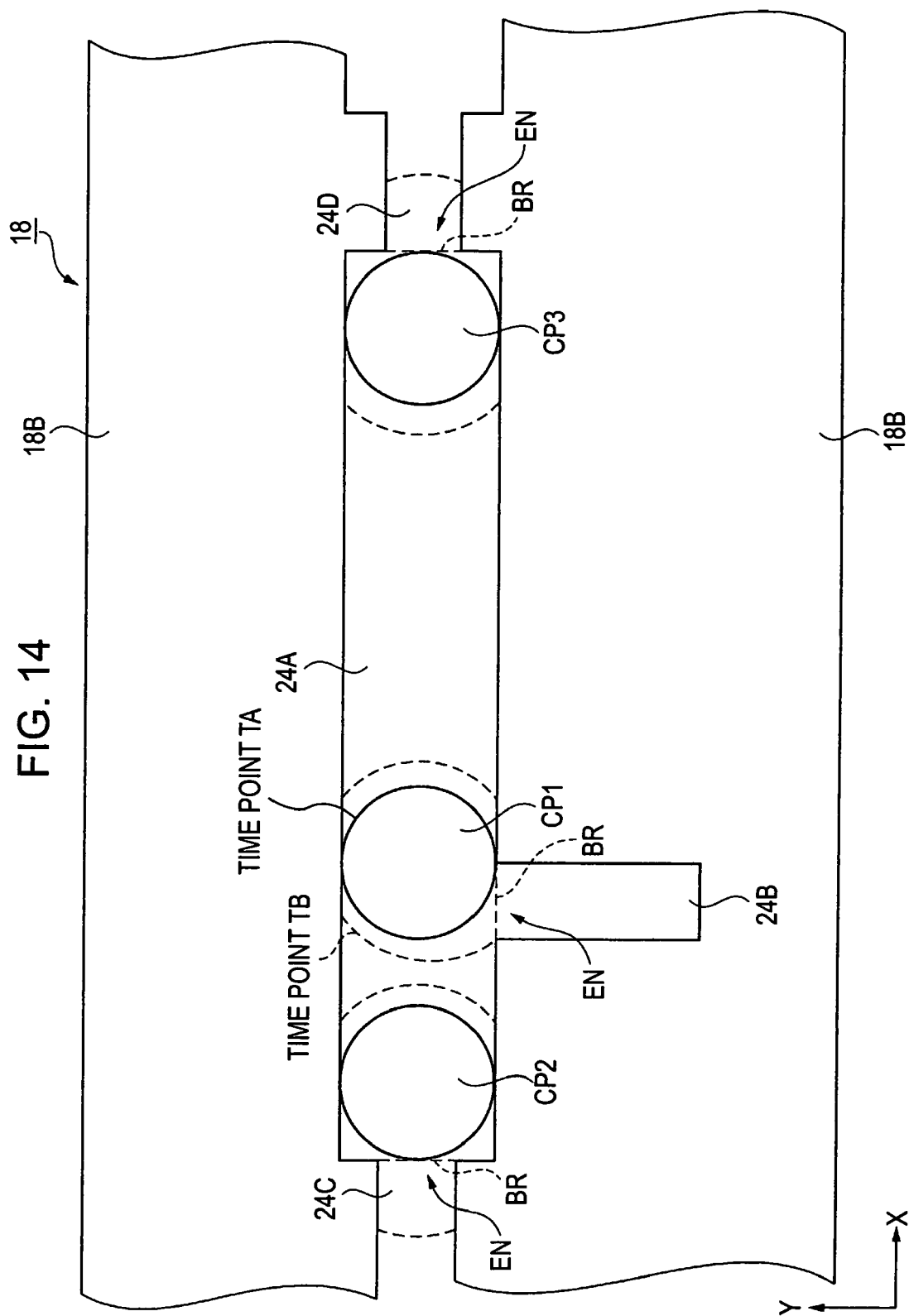
FIG. 14 is a schematic diagram showing a discharge process according to the second embodiment.
Figure 15:
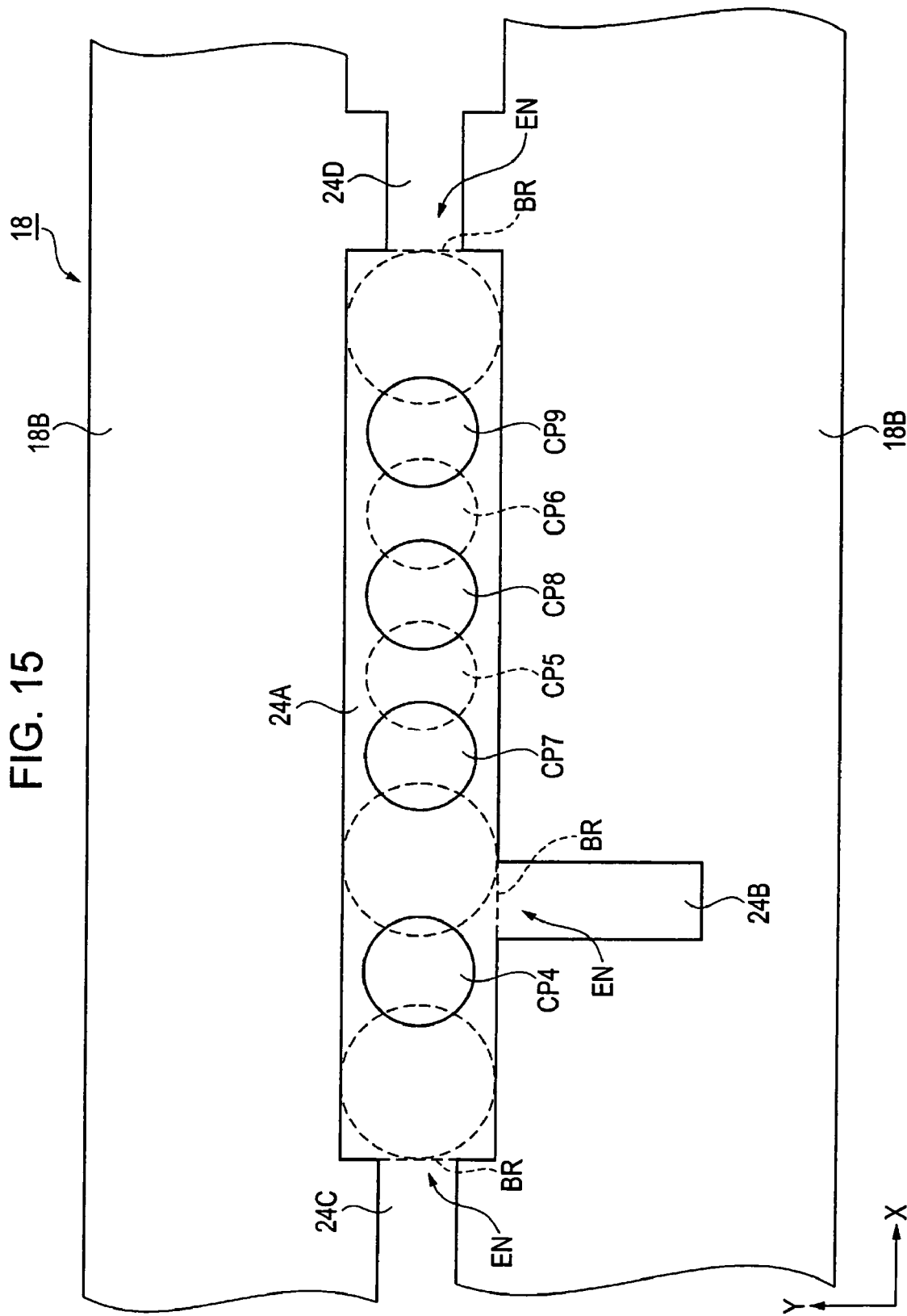
FIG. 15 is a schematic diagram showing a discharge process according to the second embodiment.

In the present embodiment, as shown in FIGS. 14 and 15, nine landing positions CP (CP1 to CP9 in the drawings) are allocated to one first region 24A in the discharge data. In FIGS. 14 and 15, white circles indicating the nine landing positions overlaps each other in the first region 24A. Further, the droplet discharge device 100 discharges droplets D toward the nine landing positions CP in the order of CP1 to CP9 on the basis of the discharge data. In this case, numbers following reference numeral "CP" indicate the order in which the droplets D are discharged in one first region 24A. Further, in FIGS. 14 and 15, these landing positions CP are lined up from a negative direction of the X-axis direction to a positive direction thereof (from the left side to the right side on the page) in the order of CP2, CP4, CP1, CP7, CP5, CP8, CP6, CP9 and CP3.

As shown in FIG. 14, the landing position CP1 does not face the boundary line BR of the second region 24B. However, the landing position CP1 among the nine landing positions CP is closest to the boundary line BR of the second region 24B. Meanwhile, the landing position CP2 faces the boundary line BR of the second region 24C. Further, the landing position CP2 among the nine landing positions CP is closest to the boundary line BR of the second region 24C. In addition, the landing position CP3 faces the boundary line BR of the second region 24D. Moreover, the landing position CP3 among the nine landing positions CP is closest to the boundary line BR of the second region 24D. Further, the positional relationship between the landing positions CP and the boundary line BR where the landing positions CP "face" the boundary line BR has been described in the first embodiment. Accordingly, description thereof will be omitted in order to avoid redundancy.

In accordance with the discharge process according to the present embodiment, in a case where a droplet D lands in the landing position CP that is closest to the boundary line BR, the droplet D does not face other droplets D in the first region 24A from a time point when the droplet D lands in the landing position CP (this is referred to as a "time point TA") until a time point when the droplet D spreads over the width w2 in the second region 24B (this is referred to as a "time point TB") by way of self-flowing (capillary phenomenon). In other words, the droplet D that lands closest to the boundary line BR over the interval is isolated from other droplets D. Further, in FIG. 14, the range of the droplet D at the time point TA is indicated by a solid line, and the range of the droplet D at the time point TB is indicated by a dotted line.

Furthermore, in the present embodiment, the droplet D does not face other droplets D in the first region 24A during a period from the time point TA to a time point when the droplet D from the landing positions CP covers the entire second region 24B (this is referred to as a "time point TC"). In this case, the time point TC is a point subsequent to the time point TB.

Furthermore, in the present embodiment, in the case where a droplet D is discharged toward a landing position CP, which is closest to any one boundary line BR, among the landing positions CP that do not face the boundary line BR, the discharge of the droplet D has the higher priority than to discharge to other landing positions CP. In particular, the discharge of the droplet D to the landing position CP1 is the top priority.

The discharge process according to the present embodiment is as follows. Before a first scanning interval begins, the droplet discharge device 100 relatively moves the discharge head unit 103 in the X-axis direction, and causes the X coordinate of one nozzle 118 to coincide with the X coordinate of the landing position CP1. If the first scanning interval begins, the droplet discharge device 100 changes the position of the nozzle 118 relative to the substrate 10A in a positive direction of the Y-axis direction. Thereafter, if the nozzle 118 reaches a position corresponding to the landing position CP1 within the first scanning interval, the droplet discharge device 100 discharges a droplet D of the conductive material 8A from the nozzle 118. By doing so, the droplet D of the conductive material 8A lands in (collides against) the landing position CP1, and then spreads from the landing position CP1 to the circumstance thereof. As a result, the conductive material 8A is coated on or applied to the landing position CP1 and the circumstance thereof.

As illustrated in FIG. 14, the landing position CP1 is closest to the boundary line BR corresponding to the second region 24B, among the nine landing positions CP. Due to this, if a droplet D lands in the landing position CP1, it reaches the inlet EN to the second region 24B, and two sides of the bank pattern 18, which border the inlet EN to the second region 24B, between the time point TA and the time point TB. As such, most of the volume of the droplet D flows into the second region 24B, rather than spreading on the first region 24A. This is because the width w2 of the second region 24B or the width of the inlet EN of the second region is smaller than the width w1 of the first region 24A. Accordingly, although any droplet D is not discharged toward the second region 24B, the conductive material 8A can be introduced from the first region 24A into the second region 24B. It is thus possible to form the conductive material layer 8B covering the second region 24B.

At this time, when the landed droplet D faces another droplet D applied to the first region 24A before it reaches the inlet EN to the second region 24B and the two sides of the bank pattern 18, which border the inlet EN to the second region 24B, the two droplets D shrink by surface tension. In such a case, the conductive material 8A may not flow into the second region 24B.

In accordance with the discharge method of the present embodiment, however, the droplet D does not face other droplets D from the time point TA when the droplet D lands in the landing position CP1 to the time point TB when the droplet D spreads over the width w2 in the second region 24B. For this reason, although the landing position CP1 does not face the boundary line BR, the droplet D can flow into the second region 24.

By discharging the droplet D of the conductive material 8A as described above, most of the volume of one droplet D that lands in the landing position that is closest to the boundary line BR can flow into the second region 24B through the boundary line BR. Further, the droplet D (the conductive material 8A) that has flown into the second region 24B forms the conductive material layer 8B that covers the second region 24B.

Therefore, according to the present embodiment, although the droplet D does not land in the second region 24B, the conductive material 8A can be introduced into the second region 24B from the first region 24A. It is thus possible to form the conductive material layer 8B covering the second region 24B. In particular, since it is not necessary to discharge any droplet D toward the second region 24B (a portion where the gate electrode 44G is formed), there is no possibility that the conductive material 8A will be adhere outside the second region 24B. In other words, residual debris does not occur in the conductive material 8A. Due to this, the conductive material layer 8B having a shape that exactly reflects the two-dimensional shape of the second region 24B can be obtained. The gate electrode 44G that is finally obtained has a gate width and a gate length which do not include an error caused by the discharge process.

After a droplet D is discharged toward the landing position CP1, the droplet discharge device 100 discharges the droplets D from the nozzles 118 to the landing positions CP2 to CP9, respectively, which are illustrated in FIGS. 14 and 15, in each of the second to ninth scanning intervals.

After the conductive material layer 8B is formed in all the plurality of pattern formation regions 24 formed in the base 10, the conductive material layer 8B is activated. To this end, the carrier device 170 locates the base 10 within the clean oven 150. If the clean oven 150 heats the substrate 10A, silver particles in the conductive material layer 8B are sintered or fused to form the conductive layer 8 that covers the pattern formation regions 24. In this case, in the pattern formation regions 24, the conductive layer 8 covering the first region 24A is the broad portion 34A, the conductive layer 8 covering the second region 24B is the narrow portion 34B (i.e., the gate electrode 44G), and the conductive layer 8 covering the second regions 24C and 24D are the narrow portions 34C and 34D.

Third Embodiment

The present embodiment is basically the same as the first or second embodiment except that the bank pattern 18 does not border the pattern formation regions 24 (the first region 24A, and the second regions 24B, 24C and 24D), but a liquid-repellant pattern 58 borders pattern formation regions 64 (a first region 64A, and second regions 64B, 64C and 64D). For that reason, the same reference numerals as those of the first or second embodiment are used to identify the same portions. Further, description overlapping with the description of the first or second embodiment will be omitted in order to avoid redundancy.

A liquid-repellant treatment process is first performed on a surface of the substrate 10A. One of the methods of the liquid-repellant treatment process may include a method of forming a self-assembled film that is made of an organic molecule film, etc. on the surface of the substrate 10A.

Molecules constituting the organic molecule film have a functional group that can be bonded to the substrate 10A, a functional group that reforms characteristics of the surface of the substrate 10A (controlling surface energy), and a normal chain of carbon or a partially branched carbon chain, which bonds these functional groups together. Further, the molecules are bonded to the substrate to form a molecule film, for example, a monomolecular film.

The self-assembled film is a film composed of molecules that are aligned in the same direction. These molecules have a bonding functional group that can react with atoms constituting the base such as a surface of the substrate 10A, etc. and other normal chain molecules. Furthermore, the molecules have a very high alignment property with the help of the interaction between normal chain molecules. Further, since the self-assembled film is composed of molecules that are aligned in the same direction, the thickness of the self-assembled film is very small. In addition, the thickness is uniform in the molecular level. The self-assembled film is also located at the same level as that of a monomolecule over the surface of the self-assembled film. A surface characteristic of the self-assembled film (e.g., a liquid-repellant property) is also uniform over the surface.

An example of a compound that can constitute the organic molecule film to be the self-assembled film, and has the liquid-repellant property is fluoroalkylsilane (hereinafter, also referred to as "FAS"). When FAS is bonded to the underlying substrate 10A, molecules are aligned in such a way that a fluoroalkyl group is located on a free surface, thereby forming a self-assembled film (hereinafter, also referred to as an "FAS film"). The surface of the FAS film on which the fluoroalkyl group is aligned has low surface energy and has a liquid-repellant property accordingly. As such, since the FAS film is formed on the surface of the substrate 10A, the liquid-repellant property is imparted to the surface of the substrate 10A. Further, the FAS film has high durability because it not only imparts the liquid-repellant property to the surface of the substrate 10A, but also has high adhesiveness to the substrate 10A.

FAS includes fluoroalkylsilane such as heptadecafluoro-1,1,2,2tetrahydrodecyltriethoxysilane, heptadecafluoro-1,1,2,2tetrahydrodecyltrimethoxysilane, heptadecafluoro-1,1,2,2tetrahydrodecyltrichlorosilane, tridecanfluoro-1,1,2,2tetrahydrooctyltriethoxysilane, tridecanfluoro-1,1,2,2tetrahydrooctyltrimethoxysilane, tridecanfluoro-1,1,2,2tetrahydrooctyltrichlorosilane and trifluoroprophyltrimethoxysilane. In use, one compound is preferably used independently. It is to be understood that two or more kinds of compounds can be used, not limited one kind of a compound, if they do not degrade a desired object of the invention.

More particularly, FAS is generally represented by the structural formula $R_nSiX_{(4-n)}$. Here, "n" indicates an integer from 1 to 3, and "X" indicates a hydrolytic group such as a methoxy group, an ethoxy group and halogen atoms. Further, "R" is a fluoroalkyl group, and has the structure of $(CF_3)(CF_3)X(CH_3)_y$ (where, "x" is an integer from 0 to 10, and "y" is an integer from 0 to 4). In a case where a plurality of R or X is bonded to Si, R and X may be the same or different from each other. The hydrolytic group indicated by X forms silanol with hydrolysis. The hydrolytic group reacts with the hydroxy group at the base such as the substrate 10A (glass, silicon, etc.), and bonds with the substrate 10A through siloxane bond. Meanwhile, since R has a fluoric group such as $CF_3$ on its surface, it is reformed into a surface (having a low surface energy), which causes a surface of an underlying object (in this case, the substrate 10A) not to get wet.

A method of forming an FAS film in a vapor phase on the substrate 10A can be explained as follows. A raw compound (i.e., FAS) and the substrate 10A are contained in the same airtight container. For example, at room temperature, they are left for about 2 to 3 days. By doing so, a self-assembled film (i.e., an FAS film) composed of an organic molecule film is formed on the substrate 10A. Further, in the event that the airtight container is maintained at a temperature of 100° C., an FAS film is formed on the substrate 10A after about three hours.

Furthermore, a method of forming an FAS film in a liquid phase on the substrate 10A can be explained as follows. A pre-treatment is first performed by irradiating the surface of the substrate 10A with UV light, or cleaning it by using a solvent. The substrate 10A is then dipped in a solution containing a raw compound (i.e., FAS), and then washed and dried to form a self-assembled film (an FAS film) on the substrate 10A. Alternatively, the pre-treatment that is performed on the surface of the substrate 10A may be omitted, if needed.

Figure 16A:
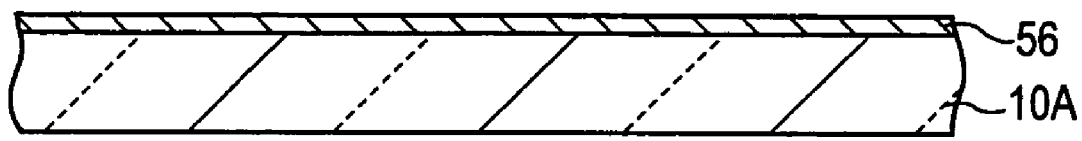
FIGS. 16A to 16C are views for explaining a method of forming a liquid-repellant pattern.
Figure 16B:
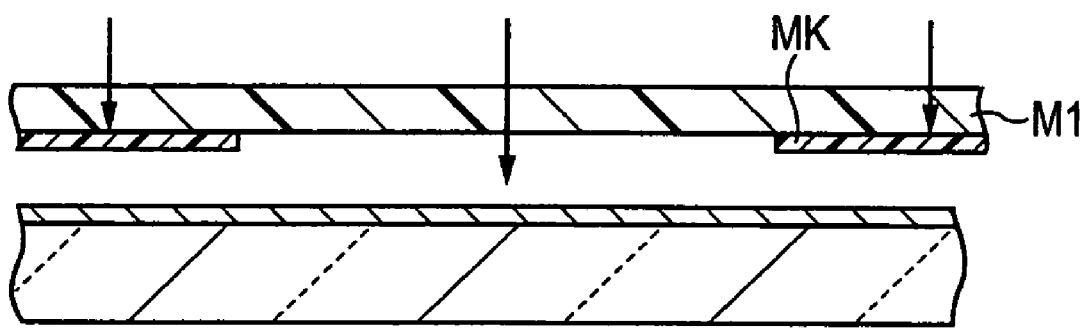
Figure 16C:
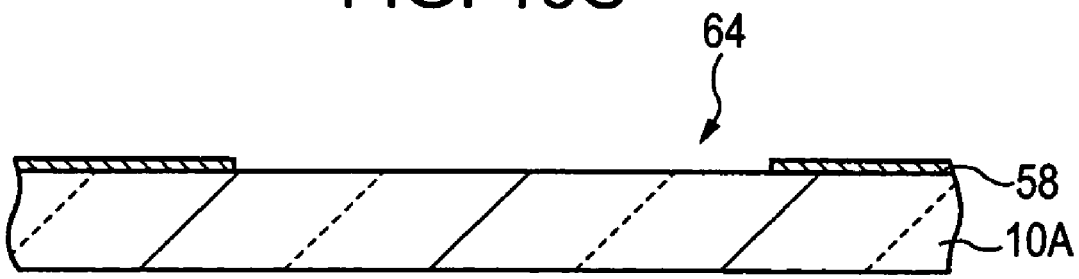

By doing so, a liquid-repellant film (an FAS film) 56 is formed on the substrate 10A, as shown in FIG. 16A. As shown in FIG. 16B, the FAS film 56 is exposed through a photo mask M1 in which a portion that borders a two-dimensional shape of a wiring pattern is covered with a light-shielding mask MK. Then, since the liquid-repellant film 56 on which light is radiated is dissolved, a liquid-repellant pattern 58 is formed, as shown in FIG. 16C. At the same time, a plurality of portions (the surface of the substrate 10A) which respectively borders the two-dimensional shape is exposed through the liquid-repellant pattern 58.

In the present embodiment, the liquid-repellant pattern 58 has a shape that completely surrounds the circumstance of each of the plurality of gate wiring lines 34 which will be formed later. It is, however, to be noted that the liquid-repellant pattern 58 may be composed of a plurality of liquid-repellant portions 58B (FIG. 17) that are separated from each other. For instance, the two-dimensional shape of one gate wiring line 34 may be bordered between a pair of the liquid-repellant portions 58B that are separated at a predetermined distance therebetween and are located parallel to each other. In this case, the liquid-repellant portions 58B may not be formed at portions corresponding to both ends of the gate wiring line 34. In other words, it is not necessary for the liquid-repellant pattern 58 to completely surround the circumstance of the two-dimensional shape of the gate wiring lines 34.

In the present embodiment, each of the plurality the portions whose two-dimensional shape is bordered by the liquid-repellant pattern 58 is also referred to as a "pattern formation region 64".

Further, one of indices indicating a liquid-repellant property of an object surface is a contact angle indicated by a material in a liquid phase on the object surface. As the contact angle indicated by the material in a liquid phase on the object surface is greater, the object surface has a liquid-repellant property higher than that of the material in a liquid phase. In the present embodiment, the contact angle indicated by the conductive material 8A on the liquid-repellant pattern 58 is at least 30°, which is greater than that indicated by the conductive material 8A on the pattern formation region 64.

As shown in FIG. 17, each of the plurality of pattern formation regions 64 includes a first region 64A having a width w1, and second regions 64B, 64C and 64D, which face the first region 64A and have a width w2 smaller than the width w1. At this time, the first region 64A is a portion of the pattern formation region 64 that extends in a first direction. Further, the first region 64A of the pattern formation region 64 is a portion where the broad portion 34A (FIG. 1) is formed in a subsequent process. Meanwhile, the second regions 64B, 64C and 64D of the pattern formation region 64 are portions where the narrow portions 34B, 34C and 34D (FIG. 1) are respectively formed in a subsequent process. The width w1 of the first region 64A is almost the same as that of the broad portion 34A (i.e., about 20 μm). Meanwhile, the width w2 of each of the second regions 64B, 64C and 64D is almost the same as that of each of the narrow portions 34B, 34C and 34D (i.e., about 10 μm).

As such, the two-dimensional shape of each of the plurality of pattern formation regions 64 is the same as that of the pattern formation region 24 according to the first or second embodiment. Further, the substrate 10A after the pattern formation region 64 is formed corresponds to the base 10 (FIG. 3).

Since the liquid-repellant film 56 is not formed in the pattern formation regions 64, the liquid-repellant property of the pattern formation region 64 is lower than that of the liquid-repellant pattern 58. To the contrary, in the present embodiment, the pattern formation region 64 has the lyophilic property to the droplet D of the conductive material 8A. This is because the pattern formation region 64 is a surface of the substrate 10A, and the substrate 10A is the glass substrate as described in the first embodiment.

After the pattern formation region 64 is formed, the droplet discharge device 100 forms the conductive layer 8 (the gate wiring line 34) on the pattern formation region 64 according to the discharge process described in the first or second embodiment.

Figure 18A:
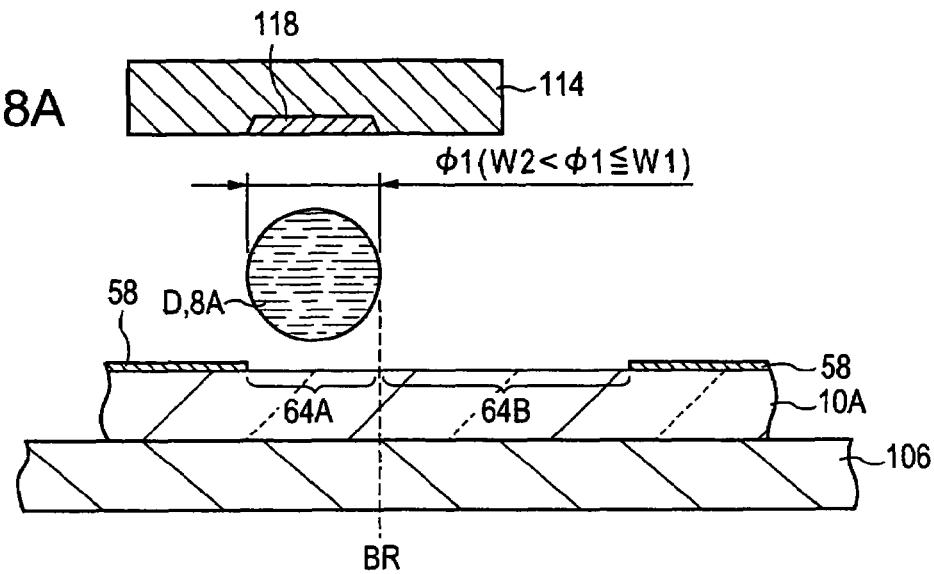
FIGS. 18A to 18D are schematic diagrams showing a discharge process according to the third embodiment.
Figure 18B:
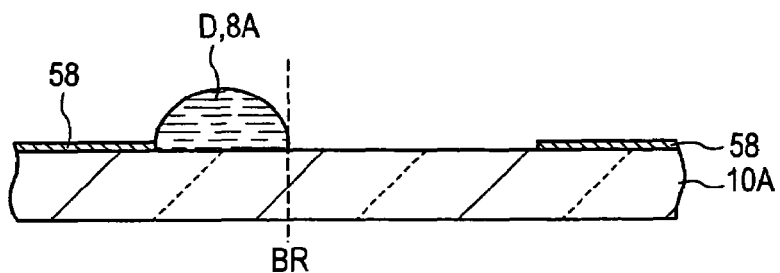
Figure 18C:
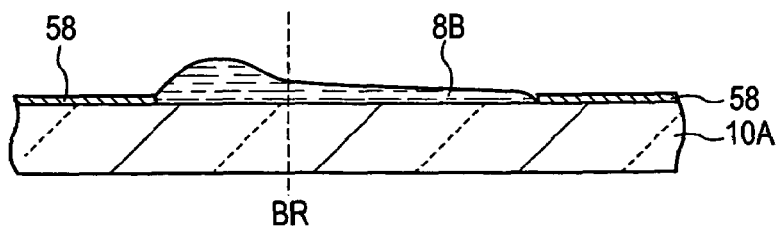

In particular, the droplet discharge device 100 changes the position of the nozzle 118 relative to the base 10 in a two-dimensional manner (the X-axis direction and the Y-axis direction). Further, as shown in FIG. 18A, whenever the nozzle 118 reaches a position corresponding to the first region 64A, it discharges droplets D of the conductive material 8A. As a result, the plurality of droplets D of the conductive material 8A land in the first region 64A, and then spread thereon, as shown in FIG. 18B. As the plurality of droplets D which have landed in the first region 64A spreads, the conductive material layer 8B that covers not only the first region 64A but also the second regions 64B, 64C and 64D is formed, as shown in FIG. 18C.

Figure 18D:
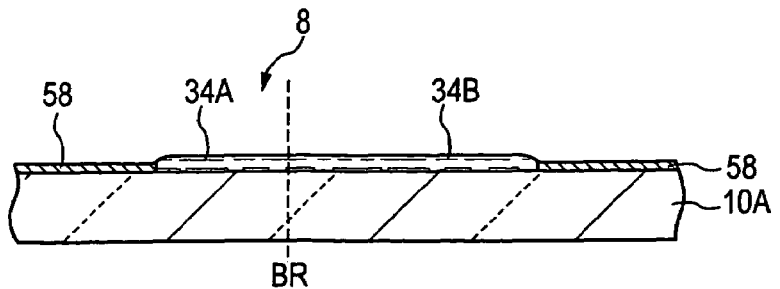

Thereafter, the conductive material layer 8B is activated using the clean oven 150 (in this case, heating), thus forming the conductive layer 8 shown in FIG. 18D. At this time, the cross sections shown in FIGS. 18A to 18D correspond to that taken along the line XVIII-XVIII in FIG. 17.

Therefore, in accordance with the present embodiment, although any droplet D is not discharged toward the second regions 64B, 64C and 64D, the conductive material 8A can be introduced into the second regions 64B, 64C and 64D from the first region 64A. It is thus possible to form the conductive material layer 8B covering the second regions 64B, 64C and 64D. To be more specific, since it is not necessary to discharge any droplet D toward the second region 64B (a portion where the gate electrode 44G is formed), there is no possibility that the conductive material 8A will be adhered outside the second region 64B. In other words, residual debris of the conductive material 8A is not generated. It is thus possible to obtain the conductive material layer 8B having a two-dimensional shape that accurately reflects the two-dimensional shape of the second region 64B. The gate electrode 44G that is finally obtained has a gate width and a gate length which do not include an error caused by the discharge process.

In accordance with the embodiment, the invention has been applied to fabrication of the gate electrode for a TFT in the liquid crystal display device. It is to be understood that the invention can also be applied to fabrication of various electrodes in other display devices, such as fabrication of a gate electrode for a TFT in an organic electroluminescent display device. The invention may also be applied to fabrication of an address electrode in a plasma display device, or fabrication of metal wiring in SED (Surface-Conduction Electron-Emitter Display) or FED (Field Emission Display).

Further, in the present specification, the liquid crystal display device, the electroluminescent display device, the plasma display device, SED, FED and the like can also be referred to as "electro-optical devices". In this case, an "electro-optical device" in the present specification refers to all devices that project, transmit or reflect light upon application of a signal voltage, as well as devices employing change of optical characteristics (so-called electro-optical effects) such as birefringence change, optical rotation change and light scattering change.

(Electronic Apparatus)

Figure 19A:
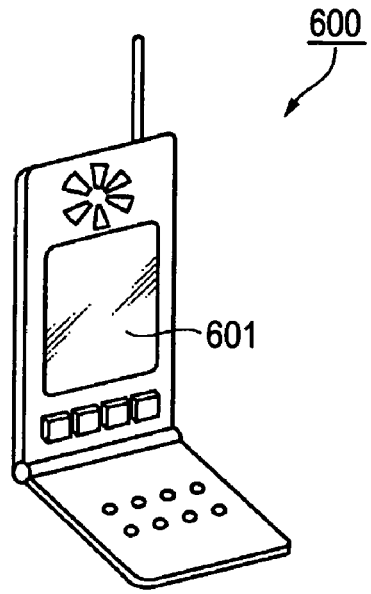
FIGS. 19A to 19C are schematic diagrams showing an electronic apparatus according to the present embodiments.
Figure 19B:
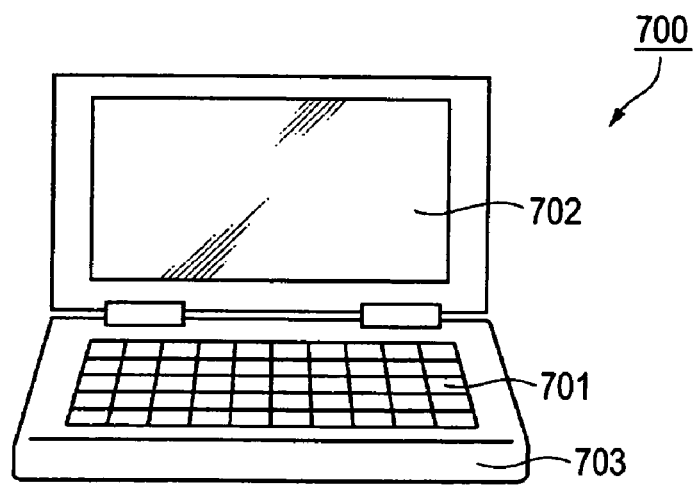
Figure 19C:
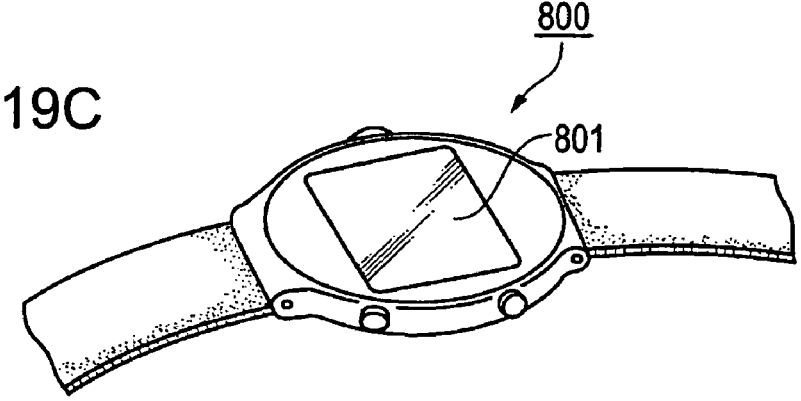

Specific examples of electronic apparatuses according to the invention will be described. A mobile telephone 600 shown in FIG. 19A includes an electro-optical device 601 fabricated according to the manufacturing method of the embodiments. A portable information processing apparatus 700 shown in FIG. 19B includes a keyboard 701, an information processing body 703, and an electro-optical device 702 fabricated according to the manufacturing method of an embodiment. Concrete examples of such a portable information processing apparatus 700 include a word processor and a personal computer. A wristwatch type electronic apparatus 800 shown in FIG. 19C includes an electro-optical device 801 fabricated according to of the manufacturing method of the embodiments. As such, the electronic apparatuses shown in FIGS. 19A to 19C include electro-optical devices fabricated according to an embodiment of the manufacturing method. It is thus possible to obtain electronic apparatuses having an electro-optical device with high TFT characteristics and high visual display performance.

While the invention has been described with reference to the particular illustrative embodiments, it is not to be restricted to the embodiments but only by the appended claims. It is to be appreciated that those skilled in the art can change or modify the embodiments without departing from the scope and spirit of the invention.

(Modification 1)

Minute conductive particles included in the conductive material 8A can be metal fine particles that contain at least one of gold, copper, aluminum, palladium and nickel, instead of silver particles. They can also include fine particles of oxides thereof, conductive polymer or superconducting materials. The minute conductive particles may have its surface coated with organic substances, etc. in order to improve the dispersibility.

(Modification 2)

The liquid-repellant treatment process of the substrate 10A in the third embodiment may be a plasma treatment, instead of formation of an FAS film. If the plasma treatment is performed, a protective layer corresponding to formation of a wiring pattern is formed on the substrate 10A. Plasma is then irradiated on the substrate 10A in an atmospheric pressure or vacuum state. In this case, the type of a gas upon irradiation of plasma can be selected in various ways in consideration of the material of a surface of the substrate 10A, etc. For example, fluorocarbon-based gases, such as 4-fluoromethane, perfluorohexane and perfluorodecane, can be used as a treatment gas. If a compound thereof is used, a fluoro-polymerization film of a liquid-repellant property can be formed on a surface of the substrate 10A. Even if such a plasma treatment is performed, the liquid-repellant pattern 58 can be formed.

(Modification 3)

In the first to third embodiments, the substrate 10A is disposed on the stage 106 such that a first direction (i.e., the direction in which the first region 24A extends) and an X-axis direction (i.e., a non-scanning direction) coincide with each other. However, the invention is not limited to such an embodiment. In particular, the substrate 10A may be disposed on the stage 106 so that the first direction and a Y-axis direction (i.e., a scanning direction) coincide with each other. Although the substrate 10A is disposed so that the first direction and the Y-axis direction coincides with each other, the discharge method described in the embodiment can be performed. Accordingly, even if any droplets D are not discharged toward the second regions 24B, 24C and 24D, the conductive layer 8 (i.e., the gate electrode 44G) covering the second regions 24B, 24C and 24D can be formed.

(Modification 4)

In accordance with the first embodiment, after the bank pattern 18 is formed, a liquid-repellant treatment process (fluorination) using a plasma treatment is performed on a surface of the bank pattern 18, making it have a liquid-repellant property. In the case where the bank pattern 18 is formed using a material having the liquid-repellant property, however, the liquid-repellant treatment process on the bank pattern 18 can be omitted. Materials having the liquid-repellant property may include acrylic fiber-based chemically amplified photoresist resin in which fluorine polymer is blended.

(Modification 5)

Each of the gate wiring lines 34, the drain electrode 44D, the source electrode 44S and the source electrode line 44SL in the first to third embodiments is composed of a silver layer. Instead of this structure, at least one of the gate wiring line 34, the drain electrode 44D, the source electrode 44S and the source electrode line 44SL may have a multi-layer structure composed of a base layer made of silver and a cap metal layer located on the base layer. The cap metal layer may be made of e.g., nickel, and facilitates an electrical connection between the gate wiring lines 34 and other wiring lines.

What is claimed is:

1. A method of forming a wiring pattern, in which a conductive material layer is formed on a substrate by discharging a plurality of droplets of a conductive material in a liquid phase using a droplet discharge device in a pattern formation region having:
    a first region, which is bordered by a bank pattern and has a first width, and
    a second region, which touches the first region and has a second width smaller than the first width, the method comprising:
    forming the conductive material layer to cover the first region and the second region by discharging the plurality of droplets having a diameter smaller than the first width and greater than the second width toward the first region, wherein
    the forming of the conductive material layer includes discharging the plurality of droplets so that one droplet among the plurality of droplets, which lands at a position closest to a boundary line between the first region and the second region, is isolated from other droplets during a predetermined period of time on the first region until the one droplet which lands at a position closest to a boundary line spreads over the width of the second region.

2. The method of claim 1, wherein
the forming of the conductive material layer further includes discharging the plurality of droplets toward only the first region of the first region and the second region.

3. The method of claim 1, wherein
the forming of the conductive material layer further includes discharging the one droplet and the other droplets so that the volume of the one droplet becomes greater than that of the other droplets.

4. A method of forming a wiring pattern, in which a conductive material layer is formed on a substrate by discharging a plurality of droplets of a conductive material in a liquid phase using a droplet discharge device in a pattern formation region having:
    a first region, which is bordered by a liquid-repellant pattern and has a first width; and
    a second region, which touches the first region and has a second width smaller than the first width, the method comprising:
    forming the conductive material layer to cover the first region and the second region by discharging the plurality of droplets having a diameter smaller than the first width and greater than the second width toward the first region, wherein
    the forming of the conductive material layer includes discharging the plurality of droplets so that one droplet among the plurality of droplets, which lands at a position closest to a boundary line between the first region and the second region, is isolated from other droplets during a predetermined period of time on the first region until the one droplet which lands at a position closest to a boundary line spreads over the width of the second region.

5. The method of claim 4, wherein
the forming of the conductive material layer further includes discharging the plurality of droplets toward only the first region of the first region and the second region.

6. The method of claim 4, wherein
the forming of the conductive material layer further includes discharging the one droplet and the other droplets so that the volume of the one droplet becomes greater than that of the other droplets.

* * * * *